United States Patent
Allen

(10) Patent No.: US 11,716,062 B2
(45) Date of Patent: Aug. 1, 2023

(54) MULTI-CHANNEL COMMON-MODE COUPLED AC GAIN AMPLIFIER

(71) Applicant: Owlet Baby Care, Inc., Lehi, UT (US)

(72) Inventor: Paul Allen, Saratoga Springs, UT (US)

(73) Assignee: Owlet Baby Care, Inc., Lehi, UT (US)

( * ) Notice: Subject to any disclaimer, the term of this patent is extended or adjusted under 35 U.S.C. 154(b) by 0 days.

(21) Appl. No.: 17/397,042

(22) Filed: Aug. 9, 2021

(65) Prior Publication Data

US 2022/0052661 A1 Feb. 17, 2022

Related U.S. Application Data

(60) Provisional application No. 63/065,197, filed on Aug. 13, 2020.

(51) Int. Cl.
| | |
|---|---|
| *H03F 3/45* | (2006.01) |
| *H03G 3/10* | (2006.01) |
| *H03G 3/00* | (2006.01) |
| *H03F 3/68* | (2006.01) |

(52) U.S. Cl.
CPC ........... *H03F 3/45636* (2013.01); *H03F 3/68* (2013.01); *H03G 3/008* (2013.01); *H03G 3/10* (2013.01)

(58) Field of Classification Search
CPC .... H03F 3/45636; H03F 3/68; H03F 3/45475; H03F 3/45; H03F 3/45183; H03F 2203/45138; H03F 3/45479; H03F 2200/111; H03F 2200/372; H03F 3/211;
(Continued)

(56) References Cited

U.S. PATENT DOCUMENTS

| | | | |
|---|---|---|---|
| 5,075,633 A | | 12/1991 | Bowers |
| 5,300,896 A | * | 4/1994 | Suesserman .......... H03F 3/4595 330/69 |

(Continued)

FOREIGN PATENT DOCUMENTS

| | | |
|---|---|---|
| CN | 105897205 A | 8/2016 |
| EP | 3240192 A1 | 11/2017 |

OTHER PUBLICATIONS

Rubio, Graciela; "Improvement of the Electrode-Amplifier Circuit for an Electromyogram Recording Device"; Project Report submitted to Worcester Polytechnic Institute faculty; May 22, 2009; 99 pages.

(Continued)

*Primary Examiner* — Khanh V Nguyen
(74) *Attorney, Agent, or Firm* — Workman Nydegger

(57) ABSTRACT

Devices, systems, and methods for multi-channel common-mode coupled alternating current (AC) gain amplifiers (MC-CM-AC Amp) are disclosed. The MC-CM-AC Amp can comprise a first operational amplifier including: a first non-inverting input port configured to be coupled to a first input signal, and a first inverting input port configured to be coupled to a first capacitor. The MC-CM-AC Amp can comprise a second operational amplifier including a second non-inverting input port configured to be coupled to a second input signal, and a second inverting input port configured to be coupled to a second capacitor. The MC-CM-AC Amp can comprise one or more gain-setting resistors configured to be coupled between the first capacitor and the second capacitor.

16 Claims, 14 Drawing Sheets

(58) Field of Classification Search
CPC ........ H03G 3/008; H03G 3/10; H03G 1/0088; H03G 1/0023; H03G 3/45098
USPC ................ 330/69, 124 R, 126, 254, 295
See application file for complete search history.

(56) References Cited

U.S. PATENT DOCUMENTS

| | | | |
|---|---|---|---|
| 5,417,221 A * | 5/1995 | Sickler | A61B 5/30 |
| | | | 600/509 |
| 5,692,050 A * | 11/1997 | Hawks | H04S 1/002 |
| | | | 381/1 |
| 5,805,716 A | 9/1998 | Clifford et al. | |
| 5,952,878 A | 9/1999 | Wu et al. | |
| 6,201,442 B1 | 3/2001 | James et al. | |
| 6,292,052 B1 | 9/2001 | Carlson | |
| 6,693,486 B1 * | 2/2004 | Brockhaus | G01F 1/60 |
| | | | 330/69 |
| 6,731,163 B2 * | 5/2004 | Huckins | H03F 1/086 |
| | | | 330/69 |
| 6,735,314 B2 * | 5/2004 | Hoover | H04S 1/002 |
| | | | 381/1 |
| 7,135,920 B2 | 11/2006 | Koen et al. | |
| 7,436,052 B2 | 10/2008 | Gerstenhaber et al. | |
| 7,847,628 B2 | 12/2010 | Dension | |
| 7,863,977 B1 * | 1/2011 | Xiang | H03F 3/45928 |
| | | | 330/147 |
| 8,390,374 B2 | 3/2013 | Alexander et al. | |
| 8,742,848 B1 | 6/2014 | Botker | |
| 8,937,509 B2 * | 1/2015 | Xu | H03F 3/45928 |
| | | | 330/258 |
| 9,083,286 B2 | 7/2015 | Kropfitsch et al. | |
| 9,294,048 B2 | 3/2016 | Van Helleputte et al. | |
| 9,319,004 B2 * | 4/2016 | Bandyopadhyay | H03F 1/34 |
| 9,912,304 B2 * | 3/2018 | Ciubotaru | H03F 3/19 |
| 10,200,029 B2 * | 2/2019 | Herrera | H03G 3/001 |
| 2001/0011925 A1 * | 8/2001 | Chee | H03F 3/45968 |
| | | | 330/69 |
| 2003/0016027 A1 | 1/2003 | McMahon et al. | |
| 2004/0008527 A1 * | 1/2004 | Honda | H02M 1/12 |
| | | | 363/39 |
| 2009/0167432 A1 | 7/2009 | Van den Heuvel | |
| 2012/0065536 A1 * | 3/2012 | Causevic | A61B 5/30 |
| | | | 600/544 |
| 2014/0145785 A1 | 5/2014 | Bandyopadhyay et al. | |
| 2016/0065151 A1 | 3/2016 | Kang et al. | |

OTHER PUBLICATIONS

Suhashina, S.; "A Low-Noise AC Coupled Instrumentation Amplifier for Recording Bio Signals", International Journal of Pure and Applied Mathematics, 2017, 10 pages, vol. 114—No. 10.
Somala, Noi; "Design and improvement of AC-Coupling Instrumentation Amplifier for Biopotential Measurements" Project Report submitted to Prince of Songkla University, 2005. 5 pages.
Amin, Abdullah; A Novel active AC coupled input stage of instrumentation amplifier for bioelectrical applications; Oct. 15, 2019, IOP Publishing Ltd.
Ilie, et al., "AC Coupled Instrumentation Amplifier with Gyrators," *2019 42nd International Spring Seminar on Electronics Technology (ISSE)*, 2019, pp. 1-5, doi: 10.1109/ISSE.2019.8810302.
Abdullah, Reza. "A High CMRR Instrumentation Amplifier for Biopotential Signal Acquisition." (2012).
Paraskevopoulou; "A low-noise instrumentation amplifier with DC suppression for recording ENG signals," *2015 37th Annual International Conference of the IEEE Engineering in Medicine and Biology Society (EMBC)*, 2015, pp. 2693-2696, doi: 10.1109/EMBC.2015.7318947.
Kitchin, Charles et al.; "A designer's Guide to Instrumentation Amplifiers"; 2006, 130 pages, $3^{rd}$ edition; Analog Devices, Inc.; U.S.A.
International Search Report for Serial No. PCT/US21/45157, dated Nov. 30, 2021, 3 pages, United States.

* cited by examiner

MULTI-CHANNEL COMMON-MODE COUPLED AC GAIN AMPLIFIER

RELATED APPLICATIONS

The present application claims the benefit of U.S. Provisional Patent Application No. 63/065,197, filed Aug. 13, 2020, the entire specification of which is hereby incorporated by reference in its entirety for all purposes.

BACKGROUND

Instrumentation Amplifiers (In-Amps) can be closed-loop gain blocks with a differential input and an output that is single ended with respect to a reference terminal. In-Amps can be used for various applications including: the amplification of pressure signals or temperature transducer signals; medical instrumentation, such as electrocardiograms (EKGs), electroencephalograms (EEGs), blood pressure monitors, and defibrillators; control electronics; software programmable applications; audio applications; video and cable radio frequency (RF) systems; power control applications; and the like. Instrumentation amplifiers (In-Amps) can have several characteristics. It can be difficult to design In-Amps to include all of these characteristics without sacrificing other characteristics.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Figure 1:
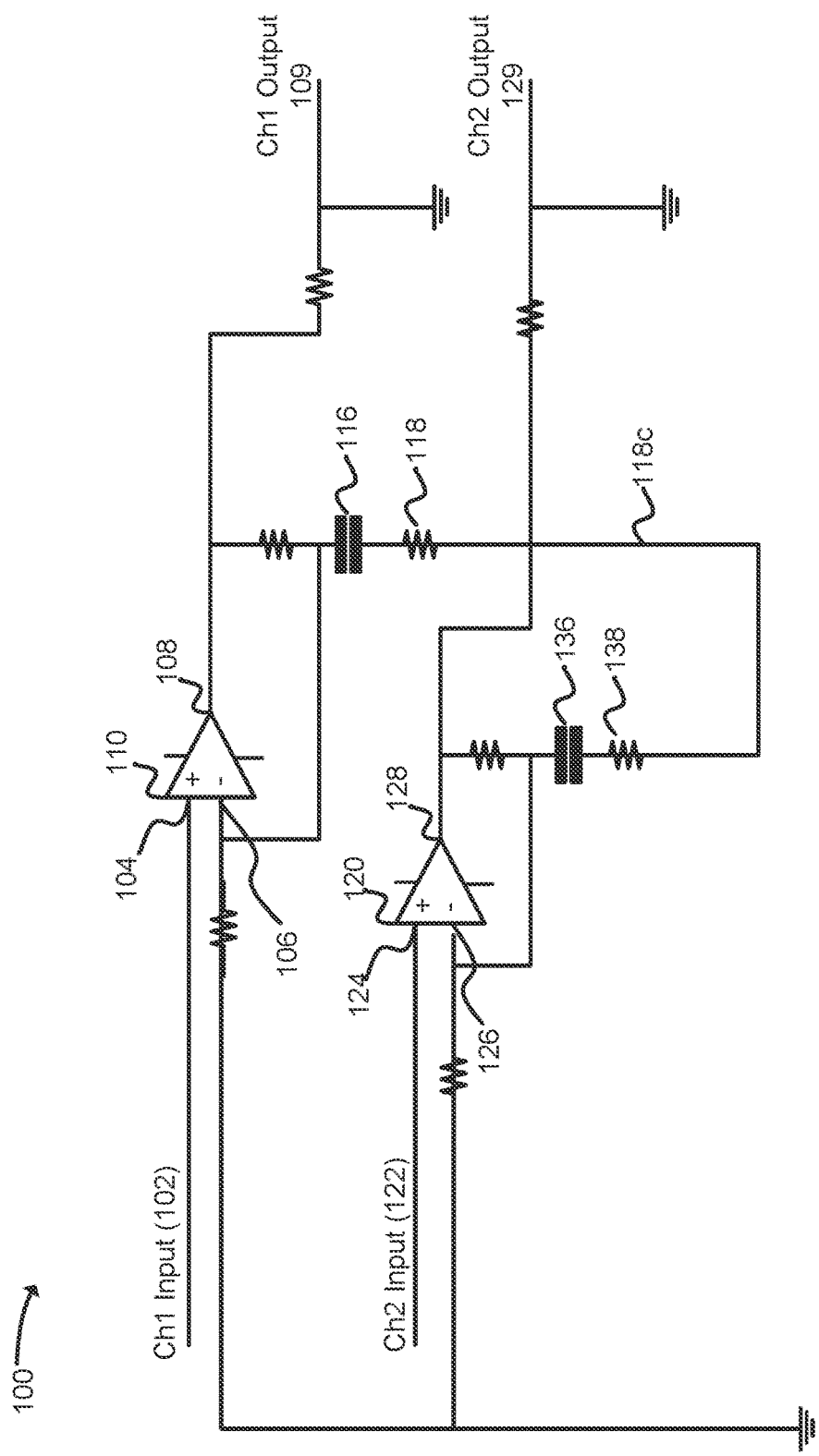
FIG. 1 is a circuit illustrating an example of an alternating current (AC) coupled gain instrumentation amplifier (In-Amp) in accordance with an example.

Reference will now be made to the exemplary embodiments illustrated, and specific language will be used herein to describe the same. It will nevertheless be understood that no limitation of the scope of the technology is thereby intended.

DETAILED DESCRIPTION

Although the following detailed description contains many specifics for the purpose of illustration, a person of ordinary skill in the art will appreciate that many variations and alterations to the following details can be made and are considered to be included herein. Accordingly, the following embodiments are set forth without any loss of generality to, and without imposing limitations upon, any claims set forth. It is also to be understood that the terminology used herein is for the purpose of describing particular embodiments only and is not intended to be limiting. Unless defined otherwise, all technical and scientific terms used herein have the same meaning as commonly understood by one of ordinary skill in the art to which this disclosure belongs.

Definitions

As used in this written description, the singular forms "a," "an" and "the" include express support for plural referents unless the context clearly dictates otherwise. Thus, for example, reference to "a sensor" includes support for a plurality of such sensors.

As used herein, "channel" refers to a separate path through which a small AC signal can be communicated. In one example, the channel can be a single-ended channel or a differential channel.

As used herein, "common-mode voltage" refers to the voltage that is common to both input terminals of an electrical device. In one example, a first signal directed to a first operational amplifier and a second signal directed to a second operational amplifier can have a voltage that is common to both the first signal and the second signal (e.g., the common-mode voltage).

As used herein, "common mode rejection" refers to the ability of an electrical device to reject common-mode signals. In one example, a common mode rejection ratio (CMRR) can be used to quantify the ability of the electrical device to reject the common-mode signals.

As used herein, "alternating current (AC)" refers to an electrical current or voltage that periodically changes its magnitude and direction continuously over time. The "AC component" of a signal can be that component of the signal that is AC.

As used herein, "direct current (DC)" refers to an electrical current or voltage that is a constant, zero-frequency, or slowly varying local mean value of a current or voltage. The "DC component" of a signal refers to the component of the signal that is DC.

As used herein, "gain" refers to a ratio of the magnitude of the output signal (e.g., voltage or current) and the input signal (e.g., voltage or current) of an electrical device. For example, an electrical device with a gain of 1 would have an output signal with a magnitude (e.g., 1V) that is equal to the magnitude (e.g., 1V) of the input signal. In another example, an electrical device with a gain of 10 would have an output signal with a magnitude (e.g., 10V) that is 10× the magnitude of the input signal (e.g., 1V).

As used herein, "operational amplifier" refers to a DC-coupled high-gain electronic voltage amplifier with a differential input and a single-ended output.

As used herein, "non-inverting input port" refers to the port of an operational amplifier that is designated V+.

As used herein, "inverting input port" refers to the port of an operational amplifier that is designated V−.

As used herein, the "output port" refers to the port of an operational amplifier that is designated Vout.

As used herein, "capacitor" refers to a device used to store an electrical charge consisting of one or more pairs of conductors separated by an insulator. The insulator can comprise various materials including dielectrics such as air, paper, plastic, glass, mica, ceramic, glass, oxide, the like, or combinations thereof. The conductors can comprise various materials including aluminum, tantalum, silver, brass, liquid mercury, carbon nanotubes, the like, or combinations thereof.

As used herein, "input signal" refers to a signal that is directed to an input port of an operational amplifier.

As used herein, "output signal" refers to a signal that is directed from an output port of an operational amplifier.

As used herein, "gain setting resistor" refers to a resistor having a resistance value that changes the gain of a signal, and that has the properties disclosed herein.

As used herein, "ground-coupled resistor" refers to a resistor coupled to ground, and that has the properties disclosed herein.

As used herein, "feedback resistor" refers to a resistor coupled to both an input port of an operational amplifier and an output port of an operational amplifier, and that has the properties disclosed herein.

As used herein, "feedback capacitor" refers to a capacitor coupled to both an input port of an operational amplifier and an output port of an operational amplifier, and that has the properties disclosed herein.

As used herein, "output filter" refers to a filter that passes a selected bandwidth of an output signal. In one example, the output filter can be a high-pass filter that passes high frequency signals of an output signal (e.g., signals higher than a selected frequency). In another example, the output filter can be a low-pass filter that passes low frequency signals of an output signal (e.g., signals lower than a selected frequency). In another example, the output filter can be a band-pass filter that a selected band of frequency signals of an output signal (e.g., signals higher than a selected low frequency and lower than a selected high frequency).

As used herein, "small signal" or "small AC signal" refer to AC signals that are small relative to DC bias currents or voltages. The small AC signal can be superimposed on the DC bias signal.

As used herein, "large signal" is a signal having sufficient magnitude to reveal a circuit's nonlinear characteristics.

As used herein, "very low frequency component" refers to a frequency component of a signal that has properties like a DC component of a signal or a large signal. In one example, a 60 Hz signal is a very low frequency signal that can have properties like a DC component of a signal or a large signal.

As used herein, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open-ended term, like "comprising" or "including," in this written description it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, comparative terms such as "increased," "decreased," "better," "worse," "higher," "lower," "enhanced," "maximized," "minimized," and the like refer to a property of a device, component, or activity that is measurably different from other devices, components, or activities in a surrounding or adjacent area, in a single device or in multiple comparable devices, in a group or class, in multiple groups or classes, or as compared to the known state of the art, or to a comparable device lacking identical features or components. For example, a data region that has an "increased" risk of corruption can refer to a region of a memory device, which is more likely to have write errors to it than other regions in the same memory device. A number of factors can cause such increased risk, including location, fabrication process, number of program pulses applied to the region, etc.

The terms "coupled" and "attached" can be used interchangeably herein and are defined as directly or indirectly connected in an electrical or nonelectrical manner. Objects or components that are attached or coupled can be merely held in a fixed relationship without necessarily being physically joined. For example, woven fibers may be attached to one another by intertwining through a weaving process. "Directly coupled" or "directly attached" objects, structures, or elements are in physical contact with one another and in some embodiments may be "merged" or "fused" for example by sintering. Objects described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, without "substantially amplifying a direct current (DC) component" of a signal would mean that the DC component of the signal completely lacks amplification or so nearly completely lacks amplification that the effect would be the same as if it completely lacked amplification. In other words, a signal can lack substantial amplification of a DC component may still actually include a degree of amplification as long as there is no measurable effect thereof. In one example, a signal can lack substantial amplification when the degree of amplification of the signal is limited to less than at least one of 20%, 10%, 5%, 1%, and 0.1%, the like, or a combination thereof of the signal.

As used herein, the term "about" is used to provide flexibility to a numerical range endpoint by providing that a given value may be "a little above" or "a little below" the endpoint. Unless otherwise stated, use of the term "about" in accordance with a specific number or numerical range should also be understood to provide support for such numerical terms or range without the term "about". For example, for the sake of convenience and brevity, a numerical range of "about 50 millivolts to about 80 millivolts" should also be understood to provide support for the range of "50 millivolts to 80 millivolts." Furthermore, it is to be understood that in this specification support for actual numerical values is provided even when the term "about" is used therewith. For example, the recitation of "about" 30 should be construed as not only providing support for values a little above and a little below 30, but also for the actual numerical value of 30 as well.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and examples can be referred to herein along with alternatives for the various components thereof. It is understood that such embodiments, examples, and alternatives are not to be construed as de facto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below, and then specific technology embodiments are described in further detail later. This initial summary is intended to aid readers in understanding the technology more quickly but is not intended to identify key features or essential features of the technology nor is it intended to limit the scope of the claimed subject matter.

When dealing with small analog signals (e.g., signals being defined as changes or fluctuations in voltage and/or current, not just steady-state signals) in real world applications, these signals can be present with common mode noise (e.g., 60 Hz signals from the electrical grid) which can sometimes be larger than the signal of interest. Because the signal of interest can be small, the user may want to amplify the small signal. However, amplifying a small signal of interest that also has large common mode signals can lead to clipping of the amplifier and loss of useful information. Instrumentation Amplifiers (In-Amps) can operate with a large amount of common-mode noise, but when there is a large steady-state signal (e.g., DC, or almost steady-state, i.e., very low frequency) present, the In-Amp may saturate with too much gain. Also, for medical devices such as EKGs and ECGs that use multiple channels, In-Amps do not provide a way of amplifying multiple channels. Unlike In-Amps, multi-channel common-mode coupled alternating current (AC) gain amplifiers (MC-CM-AC Amps) are multi-channel and can amplify small signals of interest while in the presence of large common-mode noise and large steady-state signals.

Instrumentation Amplifiers (In-Amps) can be closed-loop gain blocks with a differential input and an output that is single ended with respect to a reference terminal. In-Amps can have several characteristics such as a low Direct Current (DC) offset, low drift, low noise, high open-loop gain, high common-mode rejection, high input impedance, low non-linearity, adequate bandwidth, differential to single-ended conversion, and rail-to-rail input and output swing.

In-Amps can be used to address situations with a very high input impedance and low input bias current, but an issue can arise when trying to amplify alternating current (AC) signals in the presence of larger DC signals. For example, a larger DC signal can overwhelm the amplification of a much smaller AC signal when attempting to amplify a fetal heartbeat. To reduce the amount of noise an amplifier adds to the signal, it is beneficial to apply gain to the first stage of a circuit or system instead of applying gain in the later stages of the circuit or system to maximize the noise performance. However, when trying to amplify a small AC signal while in the presence of the large DC signal, it is desirable to remove the DC signal to prevent driving amplifier into saturation before the desired gain is achieved. In some approaches, the front of the signal can be AC coupled to the amplifier by inserting a high-pass filter, a series capacitor, and a resistor to ground, but the input impedance of the amplifier would be set by the resistor to ground. When using signals with low source impedance this approach might still be functional, but for small signals with a high source impedance (e.g., the heartbeat of a fetus in a womb) this approach does not provide adequate information because of the loss of very small signals. In another approach, low noise performance can be sacrificed by having less gain in the first stage, but the first stage of the amplifier functions as a buffer and the DC component still needs to be removed before the later stages.

One or more gain setting resistors of a multi-channel common-mode coupled alternating current (AC) gain amplifier (MC-CM-AC Amp) can be AC coupled to maintain the very high input impedance and the low input bias. In this configuration, the MC-CM-AC Amp can be less sensitive to the presence of the DC signal because the AC signal can be amplified in the presence of the DC signal without substantially amplifying the DC signal. This configuration can provide various benefits including high common mode rejection, high gain, and high input impedance with a reduced risk of saturation from the DC signal.

In one example, an MC-CM-AC Amp can comprise: a first operational amplifier (Op-Amp), a second operational amplifier, and one or more gain setting resistors. The first operational amplifier can include a first non-inverting input port configured to be coupled to a first input signal, and a first inverting input port configured to be coupled to a first capacitor. The second operational amplifier can include a second non-inverting input port configured to be coupled to a second input signal, and a second inverting input port configured to be coupled to a second capacitor. The one or more gain setting resistors can be configured to be coupled between the first capacitor and the second capacitor.

In another example, an MC-CM-AC Amp system can comprise a first operational amplifier including a first non-inverting input port configured to be coupled to a first input signal, and a first inverting input port configured to be coupled to a first capacitor and a first gain-setting resistor. The MC-CM-AC Amp system can further comprise a second operational amplifier including a second non-inverting input port configured to be coupled to a second input signal, and a second inverting input port configured to be coupled to a second capacitor and a second gain-setting resistor. The MC-CM-AC Amp system can further comprise a third operational amplifier including a third non-inverting input port configured to be coupled to a third input signal, and a third inverting input port configured to be coupled to a third capacitor and a third gain-setting resistor.

In another example, a method for amplifying a small alternating current (AC) component of a first input signal or a second input signal is provided. The method can comprise providing a first input signal to a first non-inverting input port of a first operational amplifier, and providing a second input signal to a second non-inverting input port of a second operational amplifier. The method can further comprise coupling a first capacitor and a second capacitor between a first inverting input port of the first operational amplifier and a second inverting input port of the second operational amplifier. The method can further comprise applying a selected level of gain to the small AC component of the first input signal or the second input signal using a gain setting resistor coupled between the first capacitor and the second capacitor. The method can further comprise providing an amplified small AC component of a first output signal or a second output signal.

To further describe the present technology, non-limiting examples are now provided with reference to the figures. In one example, FIG. 1 is a circuit 100 illustrating an example of a multi-channel common-mode coupled alternating current (AC) gain amplifier (MC-CM-AC Amp). A first input signal 102 can be directed to a first non-inverting input port 104 of a first operational amplifier 110. The first operational amplifier 110 can include a first inverting input port 106 and a first output port 108. In another example, a second input signal 122 can be directed to a second non-inverting input port 124 of a second operational amplifier 120. The second operational amplifier 120 can include a second inverting input port 126 and a second output port 128. In one example, the first input signal 102 can be a first channelized input signal and the second input signal 122 can a second channelized input signal.

In another example, the first inverting input port 106 of the first operational amplifier 110 can be configured to be coupled to a first capacitor 116 and the second inverting input port 126 of the second operational amplifier 120 can be configured to be coupled to a second capacitor 136. A first gain setting resistor 118 and a second gain setting resistor 138 can be configured to be coupled between the first capacitor 116 and the second capacitor 136.

In another example, one or more of the first gain setting resistor 118 or the second gain setting resistor 138 can be configured to amplify an alternating current (AC) component of one or more of the first input signal 102 or the second input signal 122 without substantially amplifying a direct current (DC) component of one or more of the first input signal 102 or the second input signal 122. In some aspects, the first input signal 102 or the second input signal 122 can have a value of from about 1 microvolt (μV) to about 1 millivolt (mV). In some aspects, the first capacitor 116 and the second capacitor 136 can be non-polarized capacitors with a capacitance ranging from about 10 microfarads (μF) to about 500 (μF). In another example, the first output signal 109 can comprise a substantially unamplified DC component (with respect to the first input signal 102) and an amplified AC component (with respect to the first input signal 102), and the second output signal 129 can comprise a substantially unamplified DC component (with respect to the second input signal 122) and an amplified AC component (with respect to the second input signal 122). In one example, the first output signal 102 can be a first channelized output signal corresponding to the channel for the first channelized input signal, and the second output signal 122 can a second channelized output signal corresponding to the channel for the second channelized input signal. In this example, the gain-setting resistor 118 can be coupled to gain-setting resistor 138 via the connection 118c. In this example, the connection 118c may not be coupled to the second output signal 129 or the second output port 128.

In-Amps and Op-Amps can both provide common-mode rejection, but In-Amps can be designed to reject common mode signals to a higher degree to prevent their appearance at the amplifier's output. Op-Amps in an inverting or non-inverting configuration may pass through common mode signals to the amplifier's output without rejection. The presence of the common-mode voltage at the amplifier's output can reduce the amplifier's available output swing and is highly undesirable. Because it is undesirable to pass a common-mode signal to the output port of an amplifier, In-Amps can include a differential.

Figure 2:
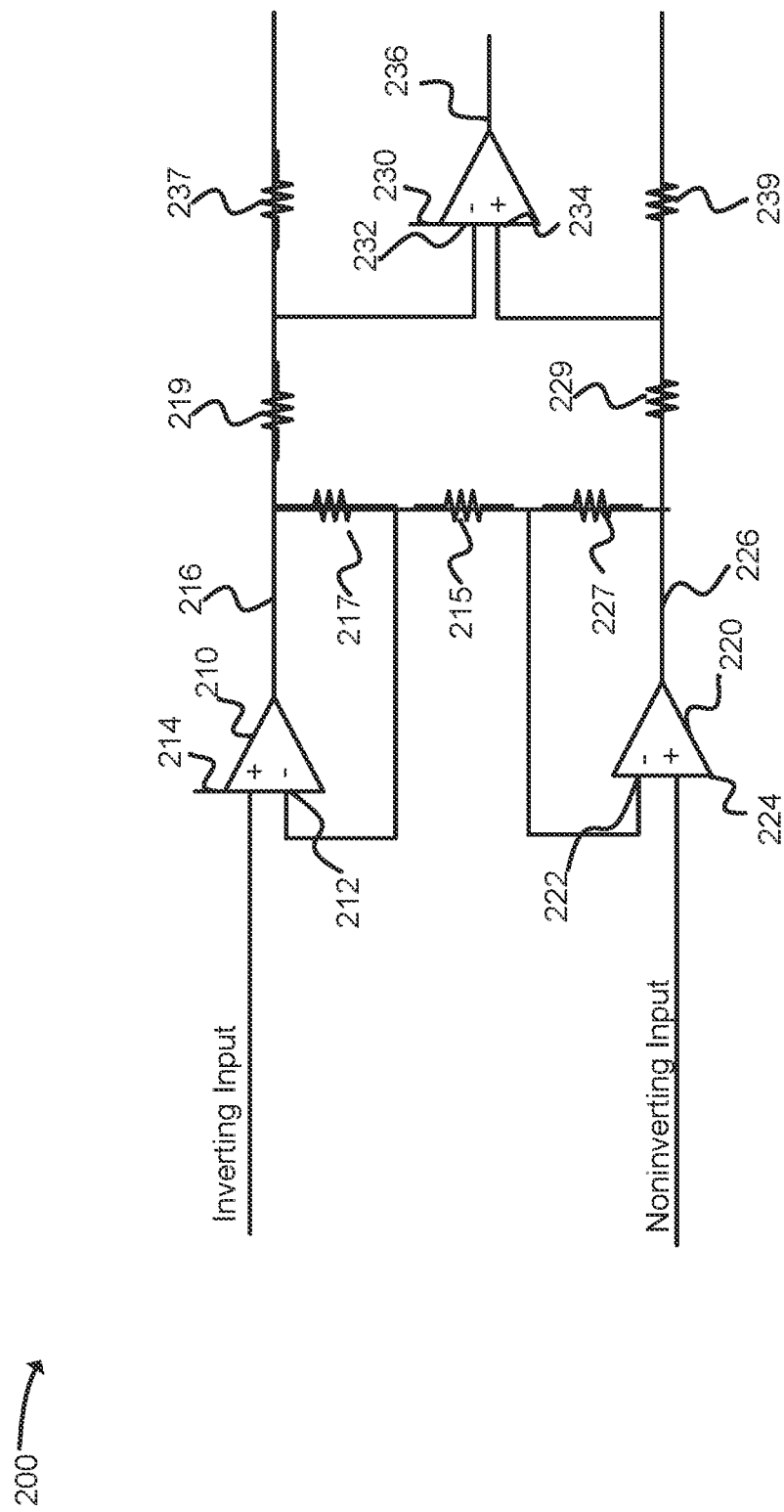
FIG. 2 is a circuit illustrating an example of a 3 operational amplifier (Op-Amp) In-Amp in accordance with an example.

FIG. 2 illustrates a 3-Op-Amp In-Amp circuit 200. A 3-Op-Amp In-Amp circuit 200 can include a first Op-Amp 210, a second Op-Amp 220 to buffer the input voltage, and a third Op-Amp 230 configured as a subtractor stage. A resistor 215 can be coupled between an inverting input port 212 of the first Op-Amp and an inverting input port 222 of the second Op-Amp. The first Op-Amp 210 can include a noninverting input port 214 and the second Op-Amp 220 can include a noninverting input port 224. The first Op-Amp 210 can include an output port 216 coupled to a resistor 217 and a resistor 219. The second Op-Amp 220 can include an output port 226 coupled to a resistor 227 and a resistor 229. The resistor 219 can be coupled to an inverting port 232 of the third Op-Amp 230 and the resistor 229 can be coupled to a noninverting port 234 of the third Op-Amp 230. The third Op-Amp 230 can include an output port 236. The inverting port 232 of the third Op-Amp 230 can be coupled to resistor 237 and the noninverting port 234 of the third Op-Amp 230 can be coupled to resistor 239.

This 3-Op-Amp In-Amp circuit 200 has various defects including: (a) sacrificing low noise performance by having less gain in the first stage, (b) the first stage of the amplifier functions as a buffer without substantial amplification of the AC signal, and (c) when operating at a high gain, the common mode voltage range can be reduced. In-Amps have been used with high common mode signals, but an MC-CM-AC Amp reduces the impact of these defects while having many of the benefits of In-Amps (e.g., low Direct Current (DC) offset, low drift, low noise, high open-loop gain, high common-mode rejection, high input impedance, low non-linearity, adequate bandwidth, differential to single-ended conversion, and rail-to-rail input and output swing) while also being multi-channel and being functional with very low AC signals having a high input impedance. In particular, the MC-CM-AC Amp can be configured for multi-channel common mode rejection among all the channels, rather than just two channels.

Figure 3A:
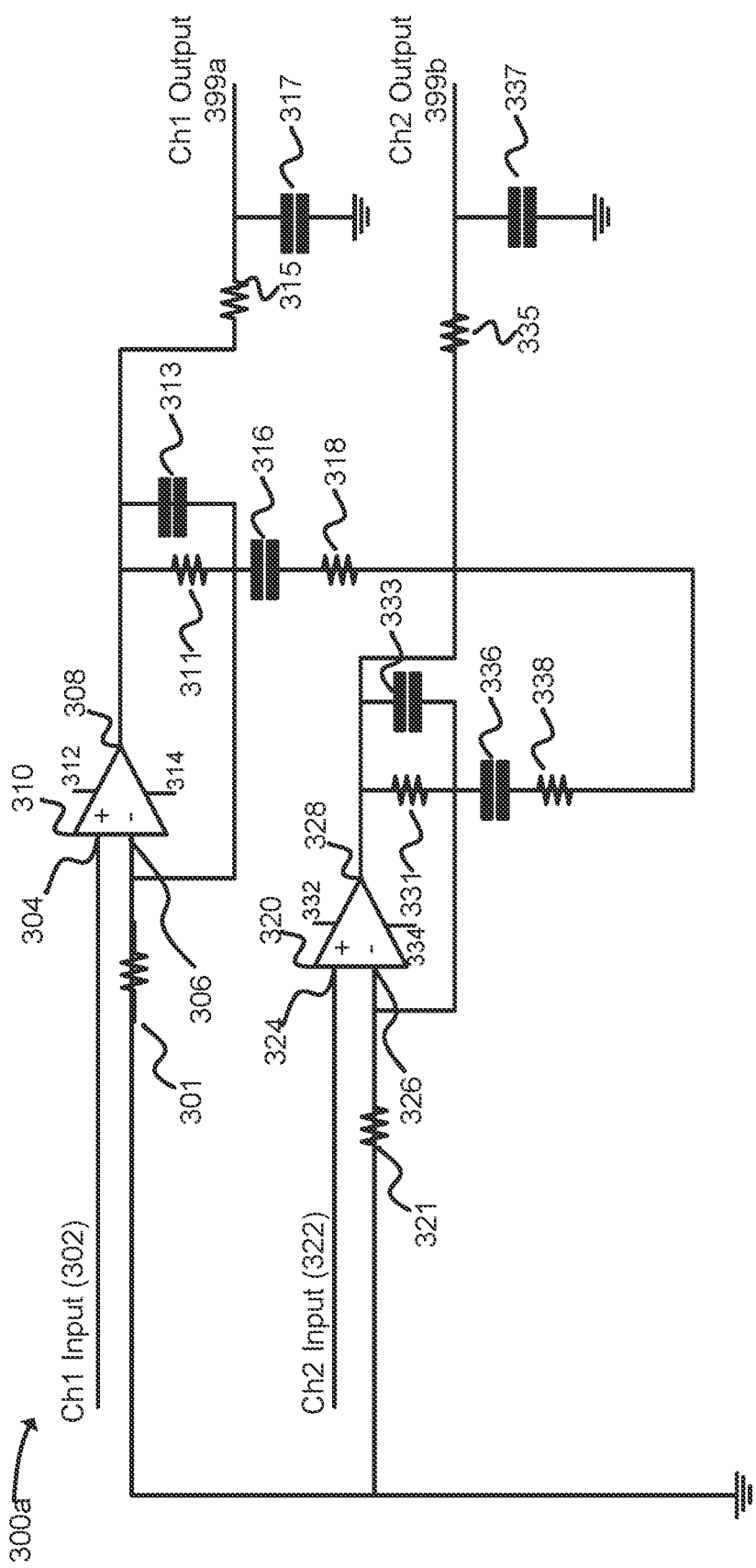
FIG. 3a is a circuit illustrating a multi-channel common-mode coupled alternating current (AC) gain amplifier (MC-CM-AC Amp) in accordance with an example.

In another example, as illustrated in FIG. 3a, a multi-channel common-mode coupled alternating current (AC) gain amplifier (MC-CM-AC Amp) 300a can be configured to operate at a high gain without a detrimental impact on low noise performance, AC signal amplification in the first stage, or the common mode voltage range. A first input signal 302 can be directed to a first non-inverting input port 304 of a first operational amplifier 310. In one example, the first input signal can have a value of from about 100 nanovolts (nV) to about 3 millivolts (mV). In one example, the input signal can have a value of about 100 nV, 200 nV, 500 nV, 1 mV, 2 mV, or 3 mV. The first operational amplifier 310 can include a first inverting input port 306 and a first output port 308. The first operational amplifier can include a positive power supply port 312 and a negative power supply port 314. The positive power supply port 312 can be configured to be coupled to a positive power supply and the negative power supply port 314 can be configured to be coupled to a negative power supply. The first output port 308 can be configured to direct a first output signal 399a. The first output port 308 can be configured to be coupled to a first output-coupled resistor 311, a first feedback-coupled capacitor 313, an additional resistor 315, and a ground-coupled capacitor 317. In one example, the first output-coupled resistor 311 can have a value of about 10 megaohms (MOhm), with a range of from about 1 MOhm to about 50 MOhm. In one example, the first feedback-coupled capacitor 313 can be configured to filter high frequencies and can have a value of about 10 nanofarads (nF), 100 pF, or any value in a range of from about 1 pF to about 100 nF. In one example, the additional resistor 315 can have a value of about 1 kOhm, with a range of from about 100 ohms to about 10 kOhm. In one example, the ground-coupled capacitor 317 can have a value of about 100 picofarads (pF), with a range from about 10 pF to about 1 μF. In another example, each of the input signals (e.g., 302) can be channelized input signals, and each of the output signals (e.g., 399a) can be channelized output signals corresponding to each channelized input signal.

In another example, the AC portion of the signal can be between 100 nV to 3 mV with a gain of 1000 (e.g., from about 3 mV to about 3V). However, the range of the AC portion of the signal can vary based on the amount of gain and the amount of voltage that is desired. A circuit with a lower gain and a voltage of 12V can amplify higher-amplitude AC signals without saturating compared to a circuit with a higher gain but a lower voltage (e.g., lower than 12V), which may not amplify as large of an AC signal. That is, the DC signals the circuit can operate with can be based on the power supplies (e.g., 12V, lower than 12V, or the like) and the associated AC signal (e.g., 100 nV to 3 mV). For example, when the DC component of the signal is a 2-volt DC signal and the amplifier is powered using a power supply of 3V, then the DC signal, which is passed but not amplified, can be present at the output, but the amplified AC signal may be limited to the 1V headroom (+/−1V). That is, a 10 mV AC signal can be amplified by 100 (to about 1V) and can fit in a headroom of about 1 V, but the 10 mV AC signal may not be amplified by 200 (to about 2V) without being saturated by the DC signal.

In another example, a second input signal 322 can be directed to a second non-inverting input port 324 of a second operational amplifier 320. In one example, the second input signal can have a value from about 100 nV to about 3 mV.

In one example, the second input signal can have a value of about 100 nV, 200 nV, 500 nV, 1 mV, 2 mV, or 3 mV. The second operational amplifier 320 can include a second inverting input port 326 and a second output port 328. The second operational amplifier can include a positive power supply port 332 and a negative power supply port 334. The positive power supply port 332 can be configured to be coupled to a positive power supply and the negative power supply port 334 can be configured to be coupled to a negative power supply. The second output port 328 can be configured to direct a second output signal 399b. The second output port 328 can be configured to be coupled to a second output-coupled resistor 331, a second feedback-coupled capacitor 333, an additional resistor 335, and a ground-coupled capacitor 337. In one example, the second output-coupled resistor 331 can have a value of about 10 MOhm, with a range of from about 1 MOhm to about 50 MOhm. In one example, the second feedback-coupled capacitor 333 can have a value of about 10 nF, or about 100 pF, with a range of from about 1 pF to about 100 nF. In one example, the additional resistor 335 can have a value of about 1 kOhm, with a range of from about 100 ohms to about 10 kOhm. In one example, the ground-coupled capacitor 337 can have a value of about 100 pF, with a range from about 10 pF to about 1 µF. In another example, each of the input signals (e.g., 302 and 322) can be channelized input signals, and each of the output signals (e.g., 399a and 399b) can be channelized output signals corresponding to each channelized input signal.

In another example, the first inverting input port 306 of the first operational amplifier 310 can be configured to be coupled to a first capacitor 316 and the second inverting input port 326 of the second operational amplifier 320 can be configured to be coupled to a second capacitor 336. A first gain setting resistor 318 and a second gain setting resistor 338 can be configured to be coupled between the first capacitor 316 and the second capacitor 336. In one example, the first capacitor 316 and the second capacitor 336 can each have a value of about 50 or about 1 with a range from about 100 pF to about 200 µF. In one example, the first gain-setting resistor and the second gain-setting resistor can each have a value of about 5 kOhm, or about 10 kOhm with a value in a range of from about 100 ohms to about 50 kOhms.

In another example, one or more of the first gain setting resistor 318 or the second gain setting resistor 338 can be configured to amplify an alternating current (AC) component of one or more of the first input signal 302 or the second input signal 322 without substantially amplifying a direct current (DC) component of one or more of the first input signal 302 or the second input signal 322. In some aspects, the AC component of the first input signal 302 or the second input signal 322 can have a value of from about 100 nanovolts (nV) to about 3 millivolt (mV). In some aspects, the DC component of the first input signal 302 of the second input signal 322 can have a value from about 100 mV to about 12 V. In some aspects, the first capacitor 316 and the second capacitor 336 can be non-polarized capacitors with a capacitance ranging from about 100 pF to about 500 µF. In some aspects, the first gain-setting resistor and the second gain-setting resistor can each have a value of from about 1 kOhm to about 10 kOhm.

In another example, the first output signal 399a can comprise a substantially unamplified DC component and an amplified AC component, and the second output signal 399b can comprise a substantially unamplified DC component and an amplified AC component. In some examples, the amount of the gain of the AC component in the first output signal 399a can be based on a voltage divider between the first output-coupled resistor 311 and the first gain-setting resistor 318. In some examples, the amount of the gain of the AC component in the second output signal 399b can be based on a voltage divider between the second output-coupled resistor 331 and the second gain-setting resistor 338. In another example, the first inverting input port 306 of the first operational amplifier 310 can be configured to be coupled to a ground-coupled resistor 301 and the second inverting input port 326 of the second operational amplifier 320 can be configured to be coupled to a ground-coupled resistor 321. In one example, the ground-coupled resistors 301 and 321 can each have a value of about 10 kOhm, with a range of from about 10 ohms to about 50 kOhm. In another example, each of the ground coupled resistors can be further coupled to one or more additional resistors (not shown) that can be coupled to ground. In another example, each of the output signals (e.g., 399a and 399b) can be channelized output signals corresponding to each of the channelized input signals (e.g., 302 and 322).

Figure 3B:
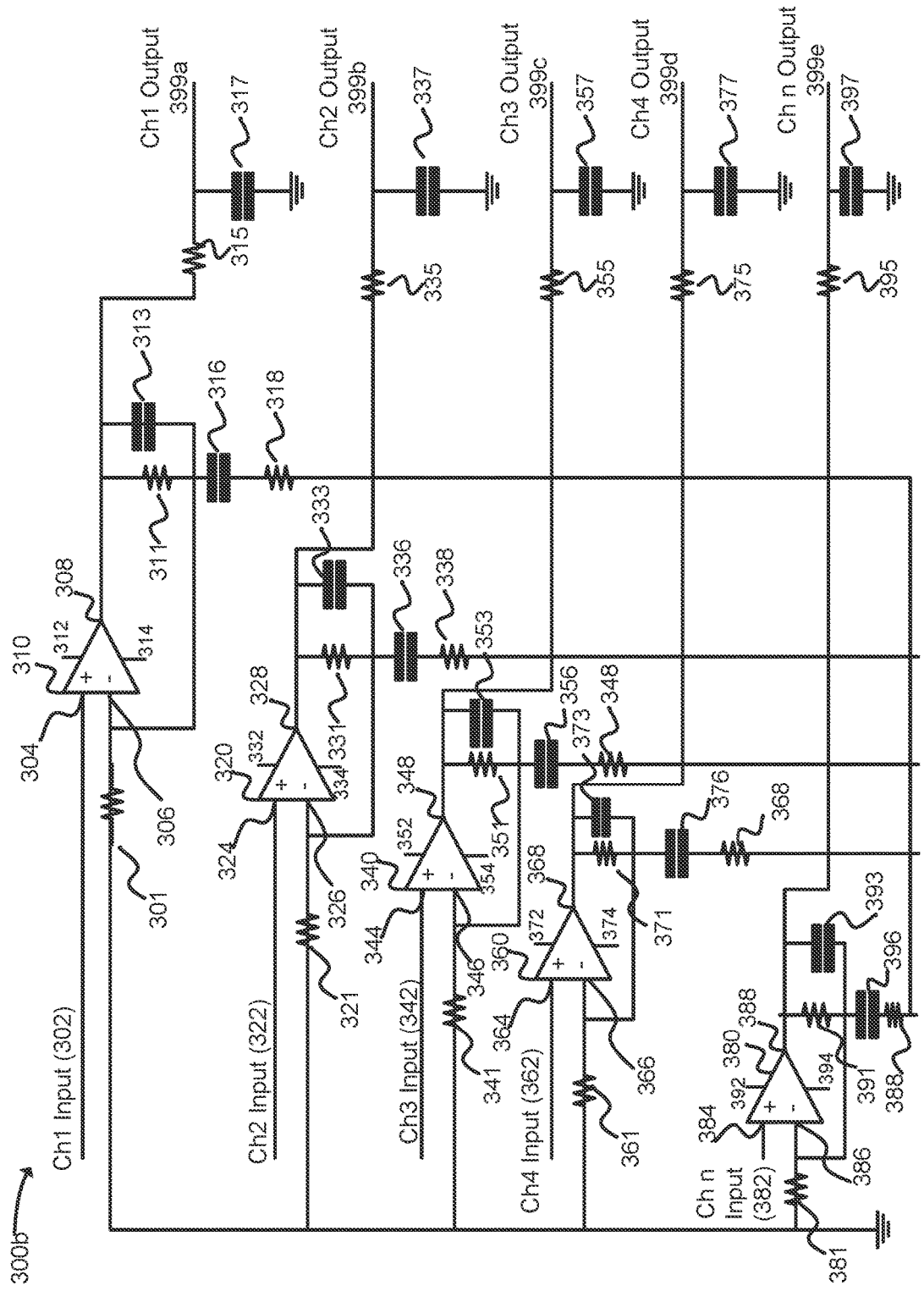
FIG. 3b is a circuit illustrating a multi-channel common-mode coupled alternating current (AC) gain amplifier (MC-CM-AC Amp) in accordance with an example.

In another example, as illustrated in FIG. 3b, a multi-channel common-mode coupled alternating current (AC) gain amplifier (MC-CM-AC Amp) 300b can further include a third operational amplifier 340, a fourth operational amplifier 360, and an nth operational amplifier 380, wherein n is an integer greater than or equal to 5. The third operational amplifier 340, the fourth operational amplifier 360, and the nth operational amplifier 380 can include the characteristics as previously described with reference to the first operational amplifier 310 and the second operational amplifier 320.

In one example, a third input signal 342, a fourth input signal 362, and an nth input signal 382 can each be directed to a non-inverting input port 344, 364, 384, respectively. The third operational amplifier 340, the fourth operational amplifier 360, and the nth operational amplifier can each include an inverting input port 346, 366, 386 and an output port 348, 368, 388. The operational amplifiers 340, 360, 380 can each include a positive power supply port 352, 372, 392 and a negative power supply port 354, 374, 394. Each positive power supply port 352, 372, 392 can be configured to be coupled to a positive power supply and each negative power supply port 354, 374, 394 can each be configured to be coupled to a negative power supply. Each output port 348, 368, 388 can be configured to direct an output signal 399c, 399d, 99e. Each output port 348, 368, 388 can be configured to be coupled to an output-coupled resistor 351, 371, 391, a feedback-coupled capacitor 353, 373, 393, an additional resistor 355, 375, 395, and a ground-coupled capacitor 357, 377, 397.

In another example, each inverting input port 346, 366, 386 of each of the operational amplifiers 340, 360, 380 can be configured to be coupled to each capacitor 356, 376, 396. A gain setting resistor 348, 368, 388 can be configured to be coupled to each capacitor 356, 376, 396. Each gain setting resistor 348, 368, 388 can be configured to amplify an alternating current (AC) component of each input signal 342, 362, 382 without substantially amplifying a direct current (DC) component of each input signal 342, 362, 382. In some aspects, one or more of the input signals 342, 362, 382 can have a value from about 100 nanovolts (nV) to about 3 millivolt (mV). In one example, the value of the one or more input signal can be about 100 nV, 200 nV, 500 nV, 1 mV, 2 mV, or 3 mV. In some aspects, one or more of the capacitors 356, 376, 396 can be non-polarized capacitors with a capacitance ranging from about 10 microfarads (µF) to about 500 (µF).

In another example, the one or more output signals 399c, 399d, 399e can comprise a substantially unamplified DC component and an amplified AC component in comparison to each of the respective input signals 342, 362, 382. In some examples, the amount of the gain of the AC component in each output signal 399c, 399d, 399e can be based on a voltage divider between each output-coupled resistor 351, 371, 391 and each gain-setting resistor 348, 368, 388. In another example, each of the inverting input ports 346, 366, 386 of each of the operational amplifiers 340, 360, 380 can be configured to be coupled to ground-coupled resistors 341, 361, 381, respectively.

Figure 4A:
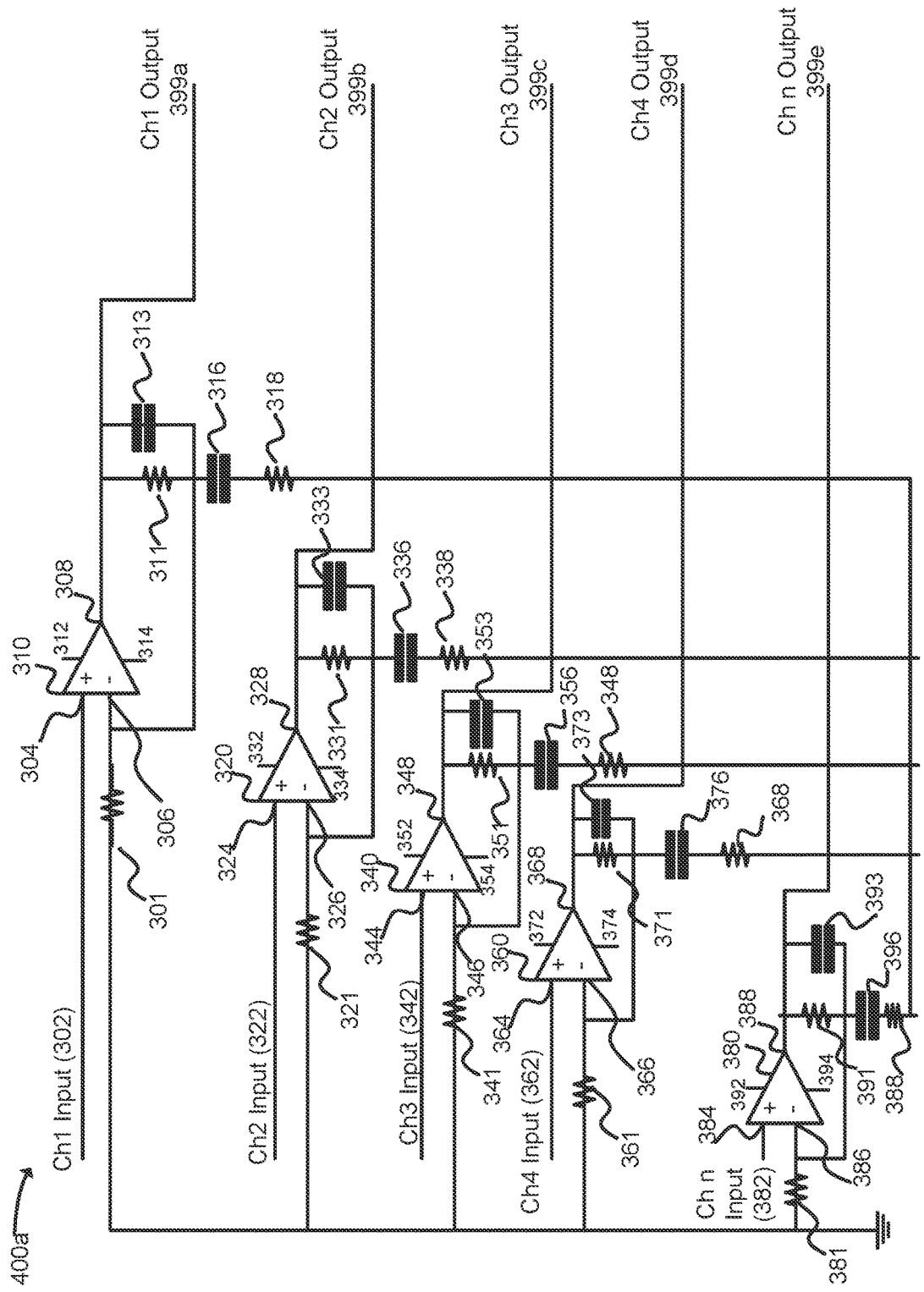
FIG. 4a is a circuit illustrating a multi-channel common-mode coupled alternating current (AC) gain amplifier (MC-CM-AC Amp) in accordance with an example.

In another example, as illustrated in the circuit 400a in FIG. 4a, each of the output ports 308, 328, 348, 368, 388 of each of the operational amplifiers 310, 320, 340, 360, 380 can be directly coupled to a channel output port 399a, 399b, 399c, 399d, 399e without the additional resistors 315, 335, 355, 375, 395 or the ground-coupled capacitors 317, 337, 357, 377, 397. Without these output filters, there may be additional high frequency interference or noise when compared to the circuit including these components.

Figure 4B:
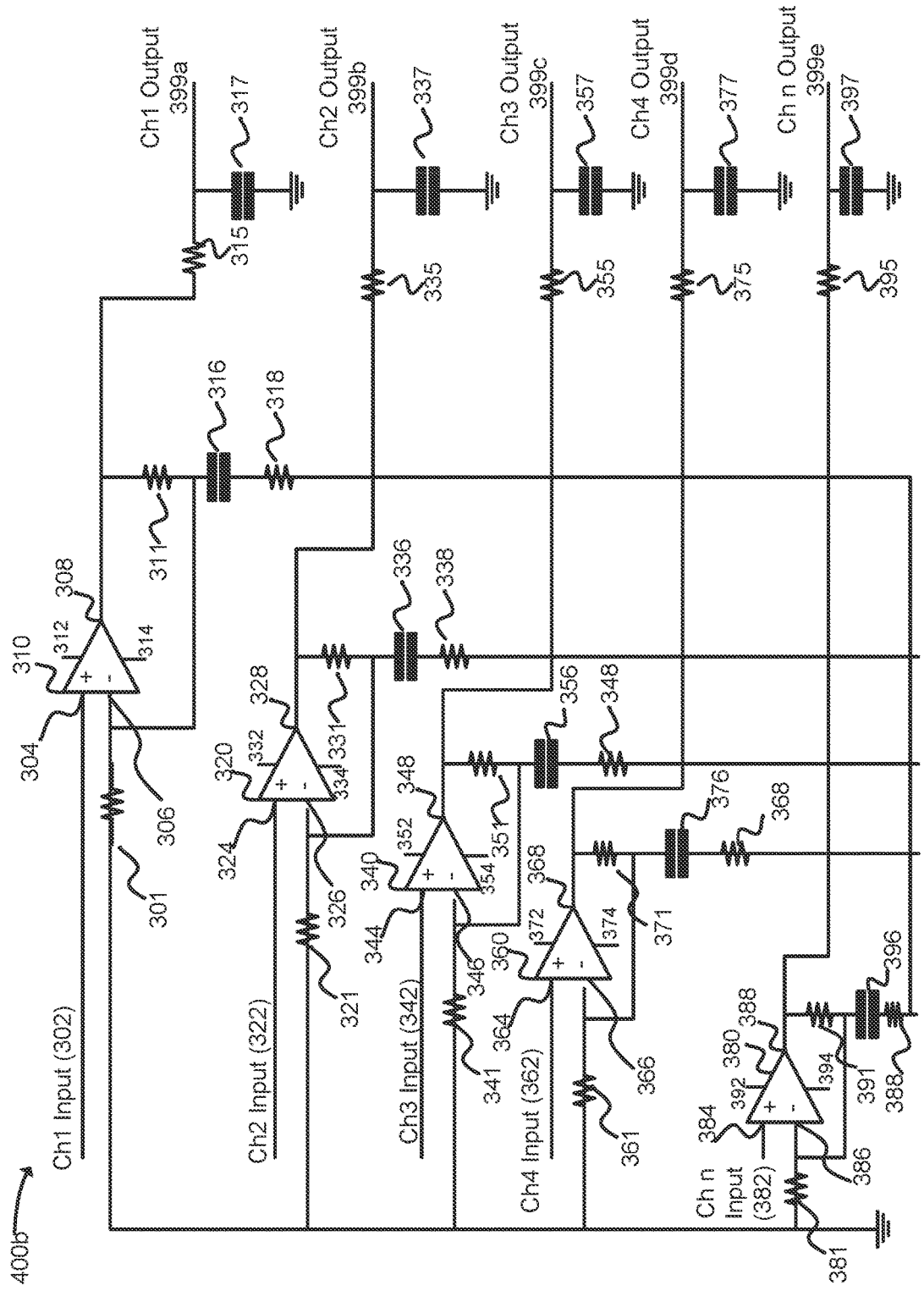
FIG. 4b is a circuit illustrating a multi-channel common-mode coupled alternating current (AC) gain amplifier (MC-CM-AC Amp) in accordance with an example.

In another example, as illustrated in the circuit 400b in FIG. 4b, each of the feedback-coupled capacitors 313, 333, 353, 373, 393 can be omitted from the circuit. Without these feedback-coupled capacitors 313, 333, 353, 373, 393, there may be some additional high frequency interference or noise when compared to the circuit including these components.

Figure 5A:
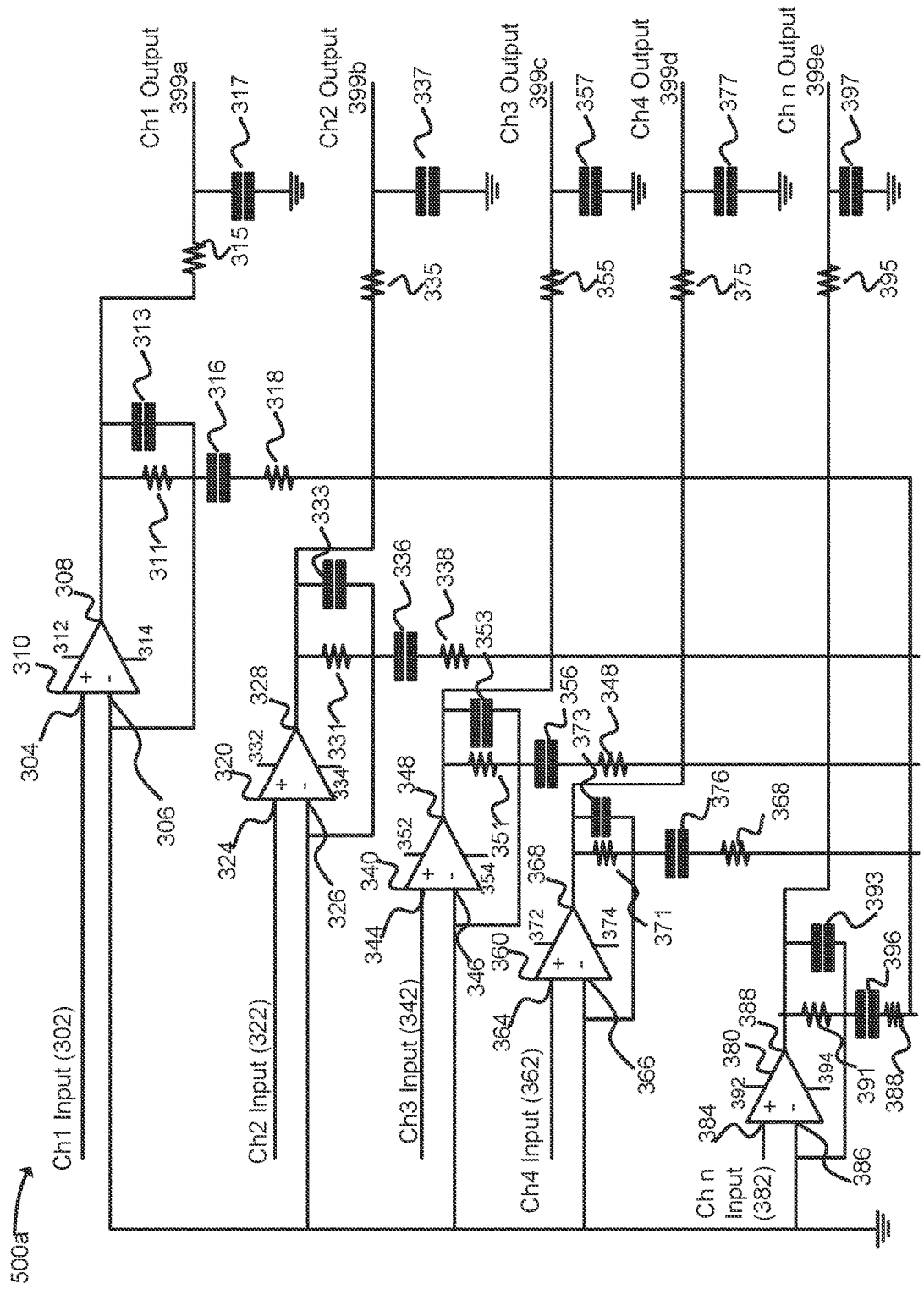
FIG. 5a is a circuit illustrating a multi-channel common-mode coupled alternating current (AC) gain amplifier (MC-CM-AC Amp) in accordance with an example.

In another example, as illustrated in the circuit 500a in FIG. 5a, each of the inverting input ports of each of the operational amplifiers 310, 320, 340, 360, 380 can be configured to be coupled to: (a) each capacitor 316, 326, 356, 376, 396, (b) each output-coupled resistor 311, 331, 351, 371, 391, and (c) each feedback-coupled capacitor 313, 333, 353, 373, 393 without being coupled to ground-coupled resistors 301, 321, 341, 361, 381, or to ground. This configuration can be operable when adequate stability can be achieved without the ground-coupled resistors 301, 321, 341, 361, 381.

Figure 5B:
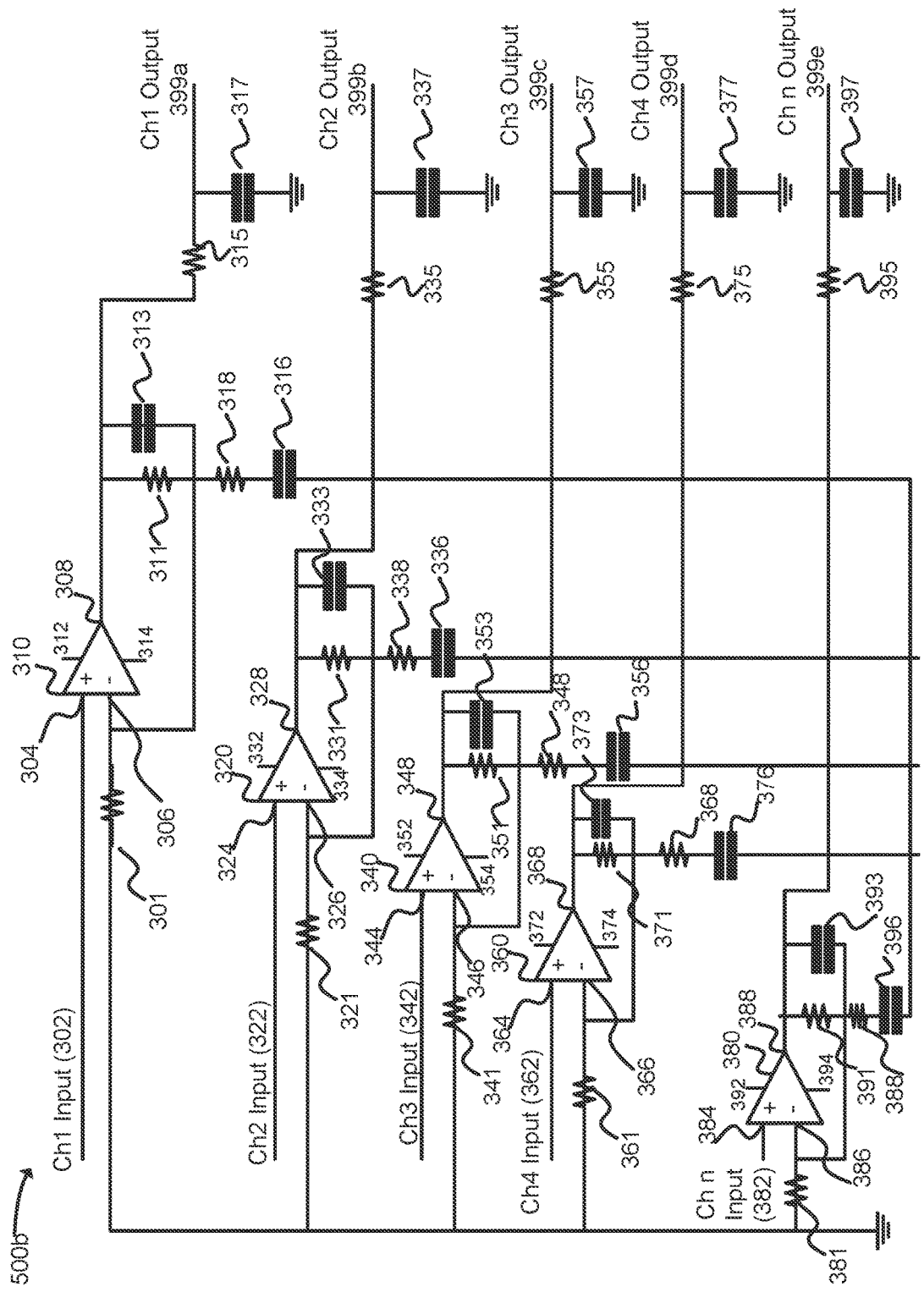
FIG. 5b is a circuit illustrating a multi-channel common-mode coupled alternating current (AC) gain amplifier (MC-CM-AC Amp) in accordance with an example.

In another example, as illustrated in the circuit 500b in FIG. 5b, the position of each of the gain-setting resistors 318, 338, 348, 368, 388 can be switched with the position of each of the capacitors 316, 326, 356, 376, 396. In this example, each of the capacitors 316, 326, 356, 376, 396 can be directly coupled to each and every one of the other capacitors 316, 326, 356, 376, 396, and each of the gain-setting resistors 318, 338, 348, 368, 388 can be directly coupled to each of the inverting ports 306, 326, 346, 366, 386 of each of the operation amplifiers 310, 320, 340, 360, 380.

Figure 5C:
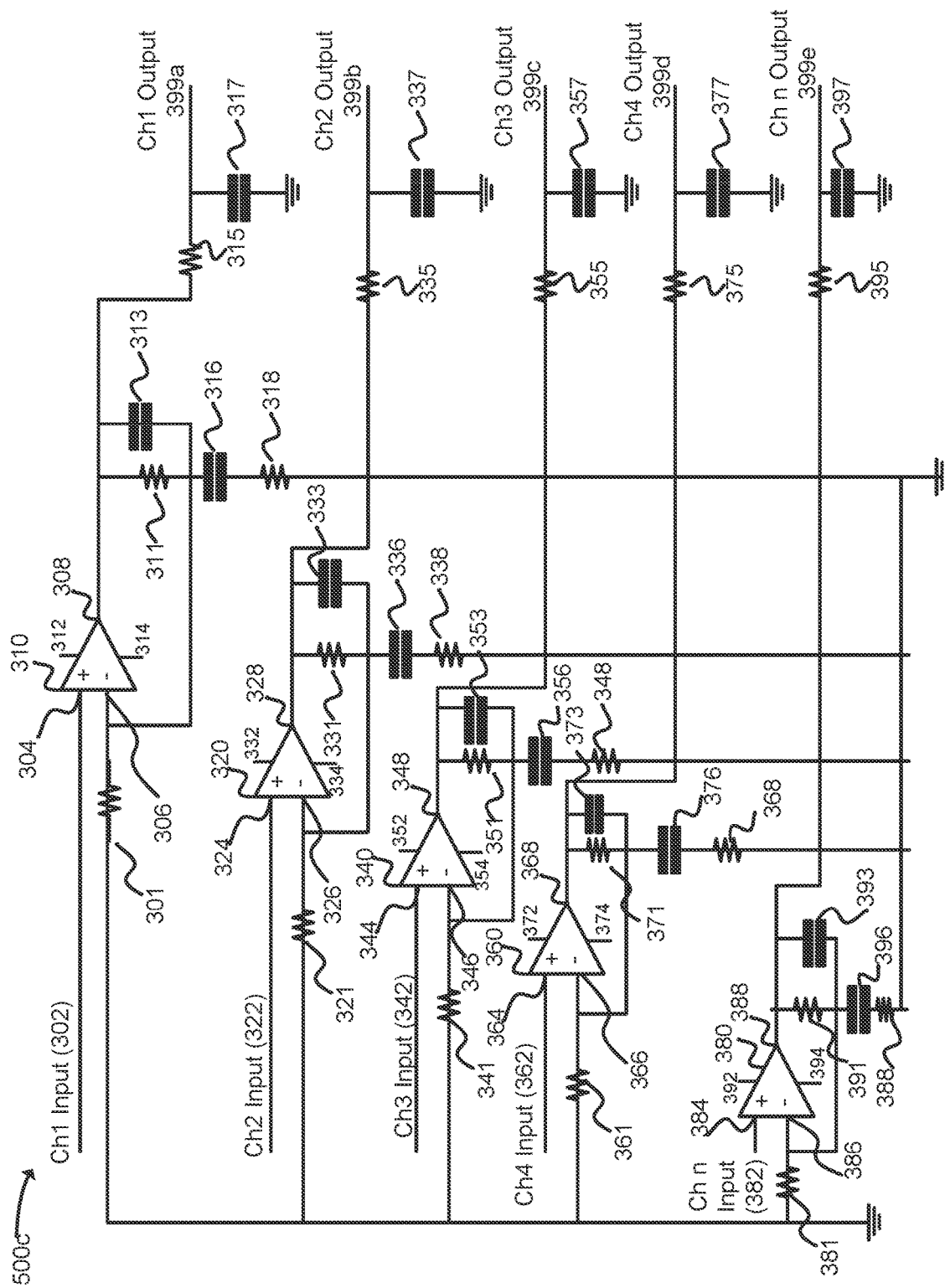
FIG. 5c is a circuit illustrating a multi-channel common-mode coupled alternating current (AC) gain amplifier (MC-CM-AC Amp) in accordance with an example.

In another example, as illustrated in the circuit 500c in FIG. 5c, when each of the gain-setting resistors 318, 338, 348, 368, 388 is directly coupled to ground, then the high common mode rejection of the circuit can be lost. However, when the gain is not greater than a threshold over which the signal is clipped, then the common mode signal can be removed later using digital signal processing. However, coupling each of the signals common to each of the operational amplifiers 310, 320, 340, 360, 380 to ground can enable a greater gain without clipping. Additionally, analog cancellation of the common mode signal can enhance the removal of the signal compared to removal using digital signal processing.

Figure 6:
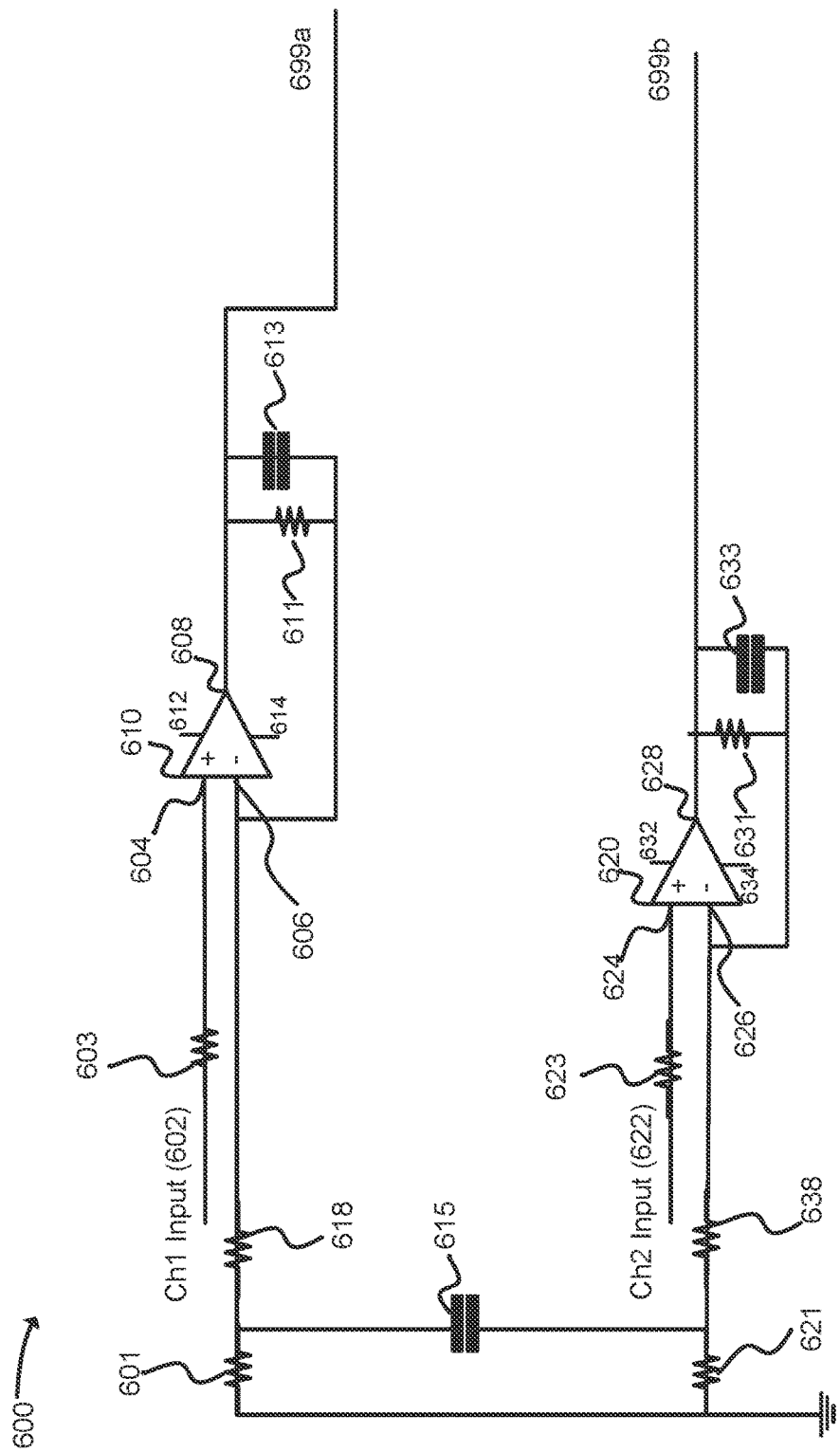
FIG. 6 is a circuit illustrating a multi-channel common-mode coupled alternating current (AC) gain amplifier (MC-CM-AC Amp) in accordance with an example.

In another example, as illustrated in the circuit 600 in FIG. 6, a first operational amplifier 610 and a second operational amplifier 620 can each be configured to be coupled to a first input signal 602 and a second input signal 622, respectively. Each input signal 602, 622 can be configured to be coupled to the non-inverting port 604, 624 of each operational amplifier 610, 620, respectively. Each operational amplifier 610, 620 can comprise a positive power supply port 612, 632 and a negative power supply port 614, 634. Each positive power supply port 612, 632 can be configured to be coupled to a positive power supply and each negative power supply port 614, 634 can be configured to be coupled to a negative power supply. Each operational amplifier can have an output signal port 608, 628 configured to direct a first output signal 699a or a second output signal 699b. The first input signal 602 can be a channelized input signal and the first output signal 699a can be a channelized output signal corresponding to the channel of the first input signal 602. The second input signal 622 can be a channelized input signal and the second output signal 699b can be a channelized output signal corresponding to the channel of the second input signal 622.

In another example, each inverting input port 606, 626 can be configured to be coupled to a feedback resistor 611, 631 and a feedback capacitor 613, 633. The feedback resistor 611, 631 and the feedback capacitor 613, 633 can be connected in parallel to the inverting input port 606, 626 and the output port 608, 628. In another example, each inverting input port 606, 626 can be coupled to a gain setting resistor 618, 638. Each gain setting resistor can be further coupled to a ground-coupled resistor 601, 621. Each of the gain-setting resistors 618 and 638 and the ground-coupled resistors 601, 621 can be coupled to a capacitor 615. This circuit configuration 600 can amplify an alternating current (AC) component of the first input signal or the second input signal without substantially amplifying a direct current (DC) component of the first input signal or the second input signal.

In some aspects, the AC component of the first input signal 602 or the second input signal 622 can have a value of from about 100 nanovolts (nV) to about 3 millivolt (mV). In some aspects, the DC component of the first input signal 602 or the second input signal 622 can have a value from about 100 mV to about 12 V. In some aspects, the capacitor 615 can be a non-polarized capacitor with a capacitance ranging from about 100 pF to about 500 µF. In some aspects, the first gain-setting resistor 618 or the second gain-setting resistor 638 can each have a value of from about 1 kOhm to about 10 kOhm. In some aspects, the ground-coupled resistors 601, 621 can have a value of about 10 MOhm, or can have a value ranging from about 1 MOhm to about 20 MOhm. In some aspects, the feedback resistors 611, 631 can have a value of about 10 MOhm, or can have a value ranging from about 1 MOhm to about 20 MOhm. In some aspects, the feedback capacitors 613, 633 can have a value of about 100 pF, or can have a value ranging from about 1 pF to about 1 µF.

Figure 7A:
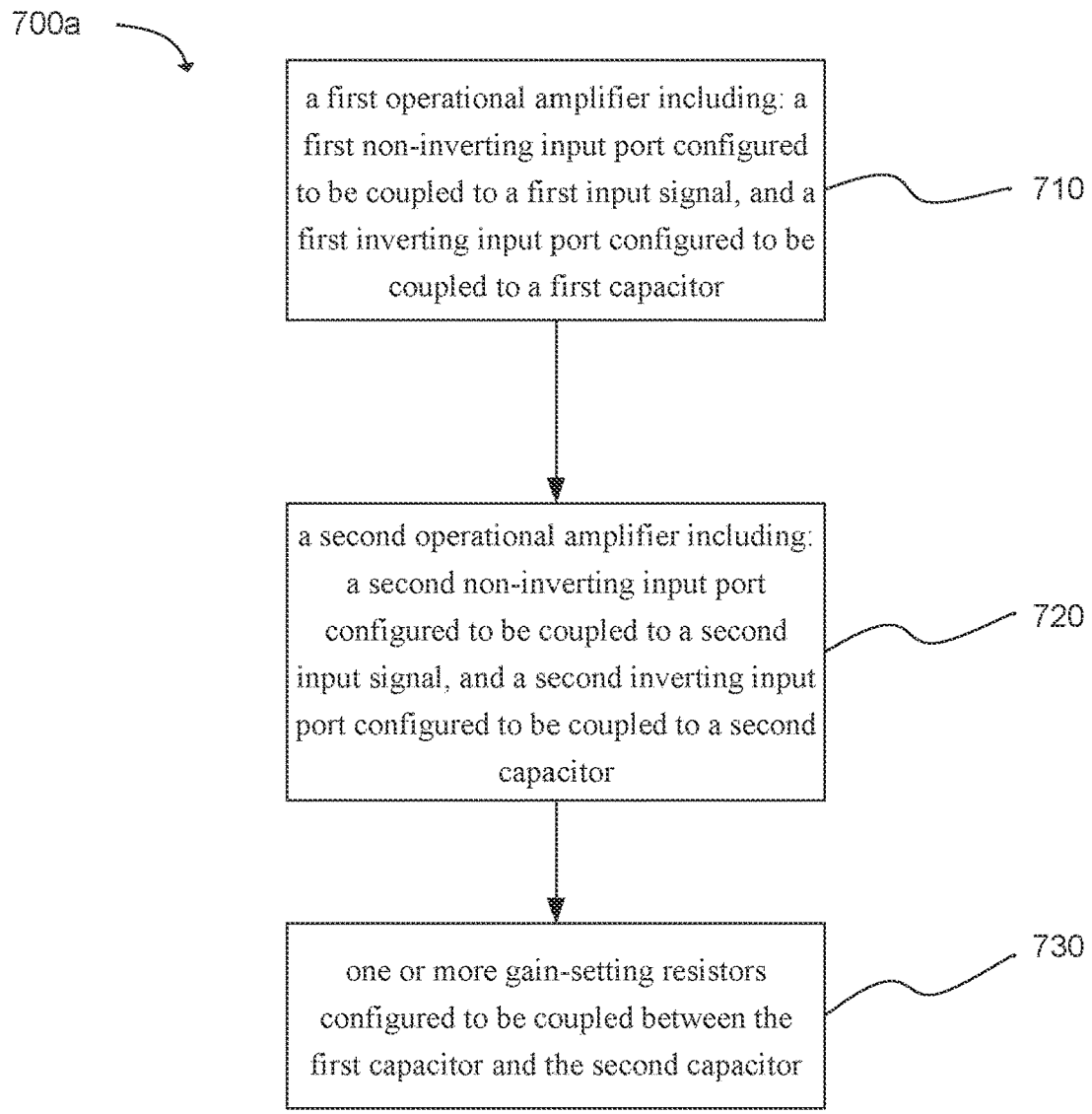
FIG. 7a is a flow diagram that illustrates an example apparatus of a multi-channel common-mode coupled alternating current (AC) gain amplifier (MC-CM-AC Amp) in accordance with an example.

FIG. 7a is a flow diagram illustrating an example multi-channel common-mode coupled alternating current (AC) gain amplifier (MC-CM-AC Amp) 700. The MC-CM-AC Amp 700 can comprise a first operational amplifier including: a first non-inverting input port configured to be coupled to a first input signal, and a first inverting input port configured to be coupled to a first capacitor, as shown in block 710. The MC-CM-AC Amp 700 can further comprise a second operational amplifier including: a second non-inverting input port configured to be coupled to a second input signal, and a second inverting input port configured to be coupled to a second capacitor, as shown in block 720. The MC-CM-AC Amp 700 can comprise one or more gain-setting resistors configured to be coupled between the first capacitor and the second capacitor, as shown in block 730.

Figure 7B:
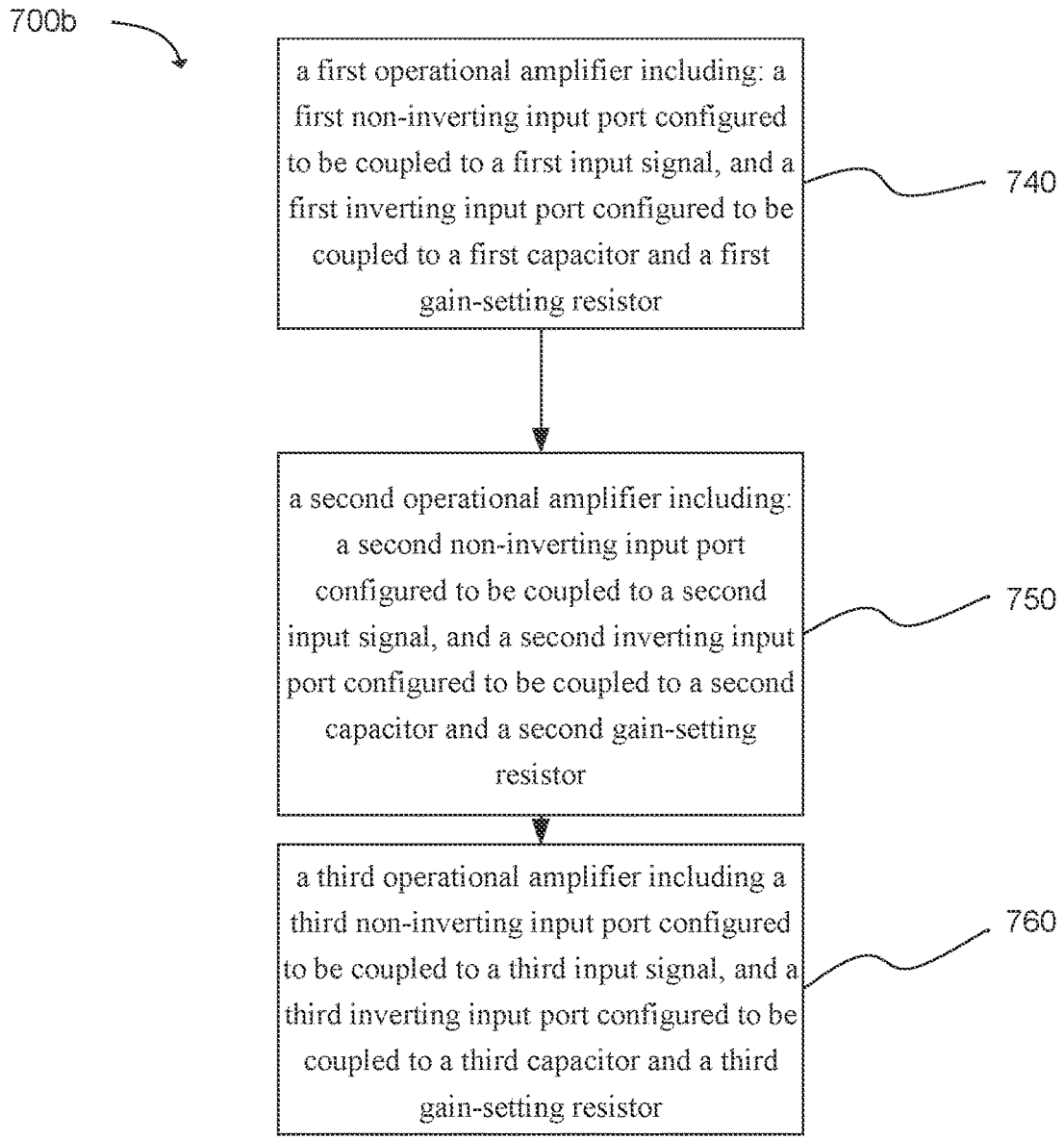
FIG. 7b depicts a flowchart for a multi-channel common-mode coupled alternating current (AC) gain amplifier (MC-CM-AC Amp) system in accordance with an example.

Another example, as depicted in FIG. 7b, provides a flow chart 700b showing a multi-channel common-mode coupled alternating current (AC) gain amplifier (MC-CM-AC Amp) system. The MC-CM-AC Amp system can comprise a first operational amplifier including: a first non-inverting input port configured to be coupled to a first input signal, and a first inverting input port configured to be coupled to a first capacitor and a first gain-setting resistor, as in block 740. The MC-CM-AC Amp system can comprise a second operational amplifier including: a second non-inverting input port configured to be coupled to a second input signal, and a second inverting input port configured to be coupled to a second capacitor and a second gain-setting resistor, as in block 750. The MC-CM-AC Amp system can comprise a third operational amplifier including a third non-inverting input port configured to be coupled to a third input signal, and a third inverting input port configured to be coupled to a third capacitor and a third gain-setting resistor, as in block 760.

Figure 7C:
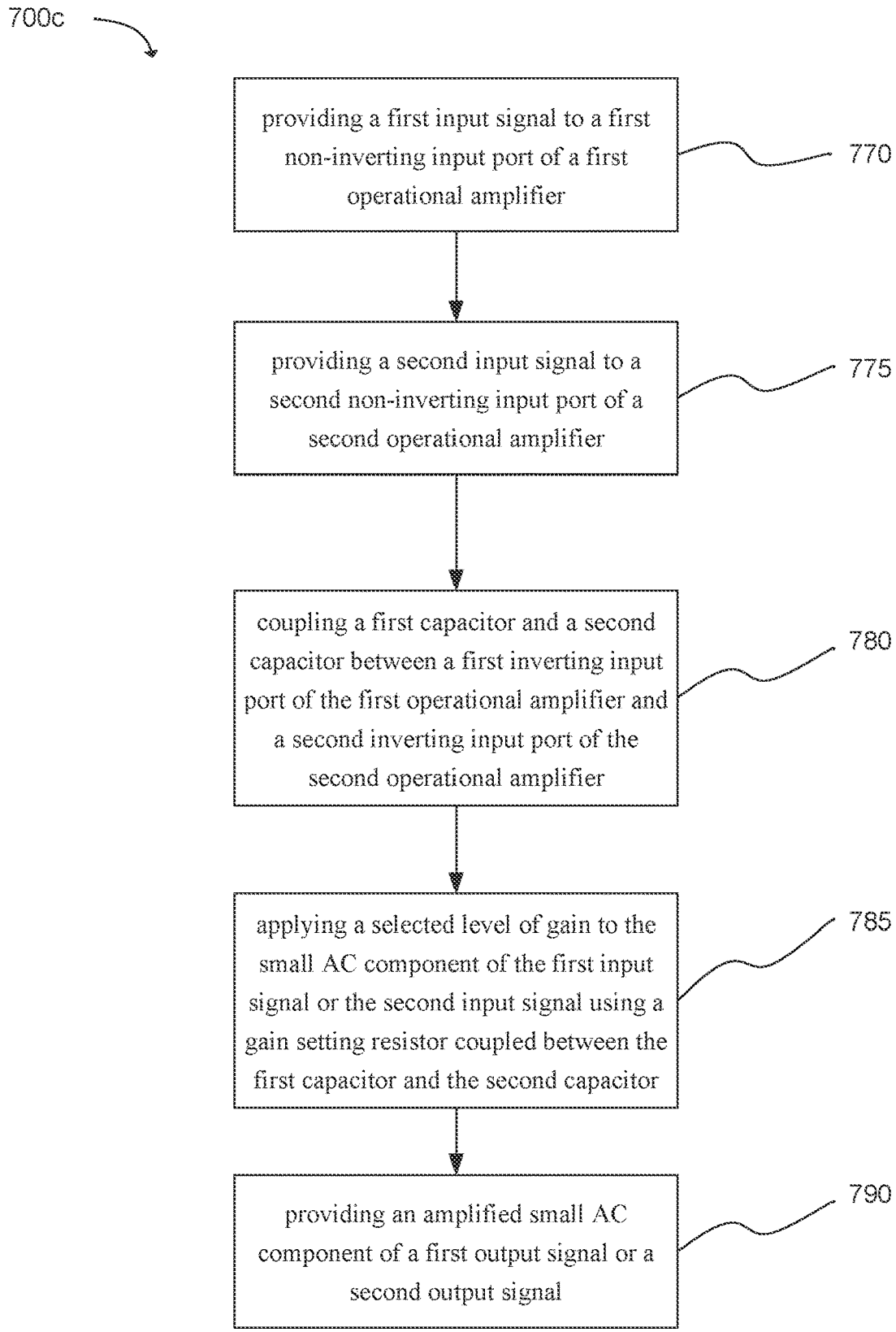
FIG. 7c depicts a method for amplifying a small alternating current (AC) component of a first input signal or a second input signal in accordance with an example.

Another example, as depicted in FIG. 7c, provides a flow chart showing a method 700c for amplifying a small alternating current (AC) component of a first input signal or a second input signal. The method can comprise providing a first input signal to a first non-inverting input port of a first operational amplifier, as in block 770. The method can comprise providing a second input signal to a second non-inverting input port of a second operational amplifier, as in block 775. The method can comprise coupling a first capacitor and a second capacitor between a first inverting input port of the first operational amplifier and a second inverting input port of the second operational amplifier, as in block 780. The method can comprise applying a selected level of gain to the small AC component of the first input signal or the second input signal using a gain setting resistor coupled between the first capacitor and the second capacitor, as in block 785. The method can comprise providing an amplified small AC component of a first output signal or a second output signal, as in block 790.

In one aspect, the method can comprise amplifying the small AC component of the first input signal or the second input signal with the selected level of gain without substantially amplifying a direct current (DC) component of the first input signal or the second input signal. In one aspect, the first input signal or the second input signal can have a source impedance of from about 10 Ohm to about 100 kOhm, about 1 kOhm to about 50 kOhm, or about 15 kOhm to about 20 kOhm. In another aspect, the first input signal or the second input signal can have a common mode noise greater than the amplitude of the small AC component of the first input signal or the second input signal. In another aspect, the first input signal or the second input signal can comprise a steady state signal including a DC component or very low frequency component (e.g., 60 Hz or lower) having an amplitude of from about 100 mV to about 12 V. In another aspect, the small AC component of the first input signal or the second input signal can have a voltage amplitude in a range of from about 100 nanovolts (nV) to about 3 millivolts (mV). In another aspect, the first capacitor or the second capacitor can be non-polarized capacitors with a capacitance ranging from about 10 microfarads to about 500 microfarads. In another aspect, one or more of the first input signal, the second input signal, the first output signal, or the second output signal can be channelized.

Figure 8:
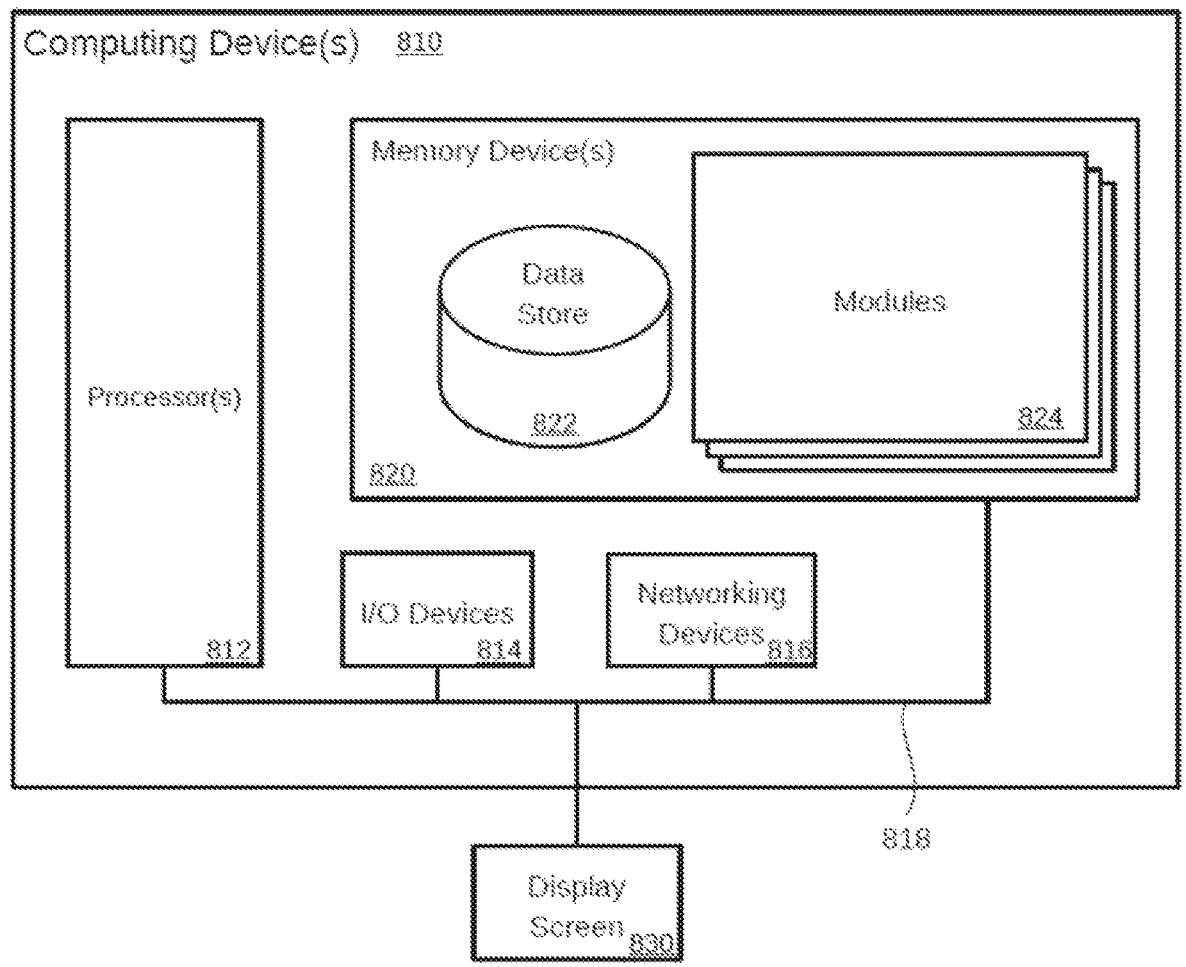
FIG. 8 is block diagram illustrating an example of a computing device that may be used in accordance with a multi-channel common-mode coupled alternating current (AC) gain amplifier (MC-CM-AC Amp) in accordance with an example.

FIG. 8 illustrates a computing device 810 on which modules of this technology may execute. A computing device 810 is illustrated on which a high-level example of the technology may be executed. The computing device 810 may include one or more processors 812 that are in communication with memory devices 820. The computing device 810 may include a local communication interface 818 for the components in the computing device. For example, the local communication interface 818 may be a local data bus and/or any related address or control busses as may be desired.

The memory device 820 may contain modules 824 that are executable by the processor(s) 812 and data for the modules 824. The modules 824 can include a power module, a data collection module, a controller module, the like, and other modules. The modules 824 may execute the functions described earlier. A data store 822 may also be located in the memory device 820 for storing data related to the modules 824 and other applications along with an operating system that is executable by the processor(s) 812.

A power module can be configured to power the electronic component. Any power source sufficient to adequately power the electronic component can be used. Batteries, capacitors, solar panels (e.g., flexible solar panels) and/or other power sources (e.g., ambient radio energy, solar energy, optical remote charging, vibration energy, kinetic energy, thermal energy, etc.) may be selected in view of the electronic component's intended purpose and duration and nature of operation. In one aspect, the power module can include a battery. In one example the battery can be a rechargeable battery. Other components can be included in the power module, for example, wires and electrical connections used to operably connect the power module to other modules within the electronic component that use power for their operation. In one specific example, the power module may include components that inductively charge the battery when exposed to an adequate external influence, such as a wireless or magnetic influence. In such embodiment, if charging of the battery is desired, the proper external influence can be brought within a sufficient range to operate the inductive components and charge the battery without physically accessing the electronic component.

Other applications may also be stored in the memory device 820 and may be executable by the processor(s) 812. Components or modules discussed in this description that may be implemented in the form of software using high-level programming languages that are compiled, interpreted, or executed using a hybrid of the methods.

The computing device 810 may also have access to I/O (input/output) devices 814 that are usable by the computing device 810. One example of an I/O device is a display screen 830 that is accessible to the computing device 810. Networking devices 816 and similar communication devices may be included in the computing device. The networking devices 816 may be wired or wireless networking devices that connect to the internet, a LAN, WAN, or other computing network.

The components or modules that are shown as being stored in the memory device 820 may be executed by the processor(s) 812. The term "executable" may mean a program file that is in a form that may be executed by a processor 812. For example, a program in a higher-level language may be compiled into machine code in a format that may be loaded into a random-access portion of the memory device 820 and executed by the processor 812, or source code may be loaded by another executable program and interpreted to generate instructions in a random-access portion of the memory to be executed by a processor. The executable program may be stored in any portion or component of the memory device 820. For example, the memory device 820 may be random access memory (RAM), read only memory (ROM), flash memory, a solid-state drive, memory card, a hard drive, optical disk, floppy disk, magnetic tape, or any other memory components.

The processor 812 may represent multiple processors and the memory device 820 may represent multiple memory units that operate in parallel to the processing circuits. This may provide parallel processing channels for the processes and data in the system. The local communication interface 818 may be used as a network to facilitate communication between any of the multiple processors and multiple memories. The local communication interface 818 may use additional systems designed for coordinating communication such as load balancing, bulk data transfer and similar systems.

Examples

The following examples pertain to specific technology embodiments and point out specific features, elements, or actions that can be used or otherwise combined in achieving such embodiments.

While the flowcharts presented for this technology may imply a specific order of execution, the order of execution may differ from what is illustrated. For example, the order of two more blocks may be rearranged relative to the order shown. Further, two or more blocks shown in succession may be executed in parallel or with partial parallelization. In some configurations, one or more blocks shown in the flow chart may be omitted or skipped. Any number of counters, state variables, warning semaphores, or messages might be added to the logical flow for purposes of enhanced utility, accounting, performance, measurement, troubleshooting or for similar reasons.

Some of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more blocks of computer instructions, which may be organized as an object, procedure, or function. Nevertheless, the executables of an identified module need not be physically located together but may comprise disparate instructions stored in different locations which comprise the module and achieve the stated purpose for the module when joined logically together.

Indeed, a module of executable code may be a single instruction, or many instructions and may even be distributed over several different code segments, among different programs and across several memory devices. Similarly, operational data may be identified and illustrated herein within modules and may be embodied in any suitable form and organized within any suitable type of data structure. The operational data may be collected as a single data set or may be distributed over different locations including over different storage devices. The modules may be passive or active, including agents operable to perform desired functions.

The technology described here may also be stored on a computer readable storage medium that includes volatile and non-volatile, removable, and non-removable media implemented with any technology for the storage of information such as computer readable instructions, data structures, program modules, or other data. Computer readable storage media include, but is not limited to, a non-transitory machine-readable storage medium, such as RAM, ROM, EEPROM, flash memory or other memory technology, CD-ROM, digital versatile disks (DVD) or other optical storage, magnetic cassettes, magnetic tapes, magnetic disk storage or other magnetic storage devices, or any other computer storage medium which may be used to store the desired information and described technology.

The devices described herein may also contain communication connections or networking apparatus and networking connections that allow the devices to communicate with other devices. Communication connections are an example of communication media.

Communication media typically embodies computer readable instructions, data structures, program modules and other data in a modulated data signal such as a carrier wave or other transport mechanism and includes any information delivery media. A "modulated data signal" means a signal that has one or more of its characteristics set or changed in such a manner as to encode information in the signal. By way of example and not limitation, communication media includes wired media such as a wired network or direct-wired connection and wireless media such as acoustic, radio frequency, infrared, and other wireless media. The term computer readable media as used herein includes communication media.

Reference was made to the examples illustrated in the drawings and specific language was used herein to describe the same. It will nevertheless be understood that no limitation of the scope of the technology is thereby intended. Alterations and further modifications of the features illustrated herein, and additional applications of the examples as illustrated herein are to be considered within the scope of the description.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. A multi-channel common-mode coupled alternating current (AC) gain amplifier (MC-CM-AC Amp) comprising:
 a first operational amplifier including:
  a first non-inverting input port configured to be coupled to a first input signal;
  a first inverting input port configured to be coupled to a first capacitor;
 a second operational amplifier including:

a second non-inverting input port configured to be coupled to a second input signal;
a second inverting input port configured to be coupled to a second capacitor; and
one or more gain-setting resistors configured to be coupled between the first capacitor and the second capacitor;
wherein the one or more gain-setting resistors is configured to amplify an alternating current (AC) component of the first input signal or the second input signal without amplifying a direct current (DC) component of the first input signal or the second input signal.

2. The MC-CM-AC Amp of claim 1, wherein the first input signal or the second input signal has a value from about 100 nanovolts to about 3 millivolts.

3. The MC-CM-AC Amp of claim 1, wherein the first capacitor or the second capacitor are non-polarized capacitors with a capacitance ranging from about 10 microfarads to about 500 microfarads.

4. The MC-CM-AC Amp of claim 1, wherein:
the first operational amplifier includes a first output port configured to direct a first output signal; and
the second operational amplifier further includes a second output port configured to direct a second output signal.

5. The MC-CM-AC Amp of claim 4, wherein:
the first input signal is channelized; or
the second input signal is channelized; or
the first output signal is channelized; or
the second output signal is channelized.

6. The MC-CM-AC Amp of claim 1, further comprising:
an nth operational amplifier including:
an nth non-inverting input port configured to be coupled to an nth input signal;
an nth inverting input port configured to be coupled to an nth capacitor; and
an nth group of gain-setting resistors configured to be coupled between the nth capacitor and one or more of the first capacitor or the second capacitor,
wherein n is an integer greater than 2.

7. A multi-channel common-mode coupled alternating current (AC) gain amplifier (MC-CM-AC Amp) system, comprising:
a first operational amplifier including: a first non-inverting input port configured to be coupled to a first input signal, and a first inverting input port configured to be coupled to a first capacitor and a first gain-setting resistor;
a second operational amplifier including: a second non-inverting input port configured to be coupled to a second input signal, and a second inverting input port configured to be coupled to a second capacitor and a second gain-setting resistor; and
a third operational amplifier including a third non-inverting input port configured to be coupled to a third input signal, and a third inverting input port configured to be coupled to a third capacitor and a third gain-setting resistor;
wherein the first capacitor and the first gain-setting resistor are configured to amplify an alternating current (AC) component of the first input signal without amplifying a direct current (DC) component of the first input signal;
wherein the second capacitor and the second gain-setting resistor are configured to amplify an AC component of the second input signal without amplifying a DC component of the second input signal; and
wherein the third capacitor and the third gain-setting resistor are configured to amplify an AC component of the third input signal without amplifying a DC component of the third input signal.

8. The MC-CM-AC Amp system of claim 7, further comprising:
a first ground-coupled resistor coupled to the first inverting input port;
a second ground-coupled resistor coupled to the second inverting input port; and
a third ground-coupled resistor coupled to the third inverting input port.

9. The MC-CM-AC Amp system of claim 7, wherein:
the first input signal is a first channel signal;
the second input signal is a second channel signal; and
the third input signal is a third channel signal.

10. The MC-CM-AC Amp system of claim 7, further comprising:
a first operational amplifier including a first output port configured to direct a first output signal; and
a second operational amplifier further including a second output port configured to direct a second output signal; and
a third operational amplifier further including a third output port configured to direct a third output signal;
wherein:
the first output signal is channelized;
the second output signal is channelized; and
the third output signal is channelized.

11. The MC-CM-AC Amp system of claim 10, further comprising:
a first feedback resistor coupled to the first output port;
a second feedback resistor coupled to the second output port; and
a third feedback resistor coupled to the third output port.

12. The MC-CM-AC Amp system of claim 10, further comprising:
a first output filter coupled to the first output port;
a second output filter coupled to the second output port; and
a third output filter coupled to the third output port.

13. The MC-CM-AC Amp system of claim 12, wherein:
the first output filter includes a first resistor in series with the first output port and a first parallel capacitor in parallel with the first output port, wherein the first parallel capacitor is coupled to ground;
the second output filter includes a second resistor in series with the second output port and a second parallel capacitor in parallel with the second output port, wherein the second parallel capacitor is coupled to ground; and
the third output filter includes a third resistor in series with the third output port and a third parallel capacitor in parallel with the third output port, wherein the third parallel capacitor is coupled to ground.

14. The MC-CM-AC Amp system of claim 7, wherein:
the first gain-setting resistor is coupled to the second gain-setting resistor and the third gain-setting resistor;
the second gain-setting resistor is coupled to the first gain-setting resistor and the third gain-setting resistor; and
the third gain-setting resistor is coupled to the first gain-setting resistor and the second gain-setting resistor.

15. A method for amplifying a small alternating current (AC) component of a first input signal or a second input signal, comprising:

providing a first input signal to a first non-inverting input port of a first operational amplifier;

providing a second input signal to a second non-inverting input port of a second operational amplifier;

coupling a first capacitor and a second capacitor between a first inverting input port of the first operational amplifier and a second inverting input port of the second operational amplifier;

applying a selected level of gain to the small AC component of the first input signal or the second input signal using a gain setting resistor coupled between the first capacitor and the second capacitor; and providing an amplified small AC component of a first output signal or a second output signal; and amplifying the small AC component of the first input signal or the second input signal with the selected level of gain without substantially amplifying a direct current (DC) component of the first input signal or the second input signal.

16. The method of claim 15, wherein the first input signal or the second input signal has a source impedance of from 15 kOhm to 20 kOhm.

\* \* \* \* \*